(12) United States Patent
Wang et al.

(10) Patent No.: US 11,587,916 B2
(45) Date of Patent: Feb. 21, 2023

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Chuei-Tang Wang, Taichung (TW); Chung-Hao Tsai, Changhua County (TW); Chen-Hua Yu, Hsinchu (TW); Tzu-Chun Tang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 48 days.

(21) Appl. No.: 17/192,816

(22) Filed: Mar. 4, 2021

(65) Prior Publication Data
US 2022/0285331 A1 Sep. 8, 2022

(51) Int. Cl.
| | |
|---|---|
| *H01L 23/552* | (2006.01) |
| *H01L 25/16* | (2023.01) |
| *H01L 23/31* | (2006.01) |
| *H01L 23/00* | (2006.01) |
| *H01L 23/66* | (2006.01) |
| *H01L 23/48* | (2006.01) |
| *H01Q 9/04* | (2006.01) |
| *H01Q 9/16* | (2006.01) |
| *H01L 21/56* | (2006.01) |
| *H01Q 21/06* | (2006.01) |
| *H01Q 21/08* | (2006.01) |

(52) U.S. Cl.
CPC ............ *H01L 25/16* (2013.01); *H01L 21/561* (2013.01); *H01L 23/3107* (2013.01); *H01L 23/481* (2013.01); *H01L 23/552* (2013.01); *H01L 23/66* (2013.01); *H01L 24/19* (2013.01); *H01L 24/24* (2013.01); *H01Q 9/0407* (2013.01); *H01Q 9/16* (2013.01); *H01L 2223/6677* (2013.01); *H01L 2224/24265* (2013.01); *H01Q 21/061* (2013.01); *H01Q 21/08* (2013.01)

(58) Field of Classification Search
CPC combination set(s) only.
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |

(Continued)

*Primary Examiner* — Niki H Nguyen
(74) *Attorney, Agent, or Firm* — JCIPRNET

(57) ABSTRACT

A package structure includes a semiconductor die, an antenna substrate structure, and a redistribution layer. The semiconductor die is laterally wrapped by a first encapsulant. The antenna substrate structure is disposed over the semiconductor die, wherein the antenna substrate structure includes a circuit substrate and at least one antenna element inlaid in the circuit substrate. The redistribution layer is disposed between the semiconductor die and the antenna substrate structure, wherein the at least one antenna element is electrically connected with the semiconductor die through the circuit substrate and the redistribution layer. The at least one antenna element includes patch antennas.

20 Claims, 19 Drawing Sheets

(56) References Cited

U.S. PATENT DOCUMENTS

| | | |
|---|---|---|
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2017/0346185 A1* | 11/2017 | Wang .................. H01Q 1/2283 |
| 2018/0331041 A1* | 11/2018 | Liao .................. H01L 21/76837 |
| 2022/0148983 A1* | 5/2022 | Lee ...................... H01Q 9/0414 |

* cited by examiner

PACKAGE STRUCTURE AND MANUFACTURING METHOD THEREOF

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
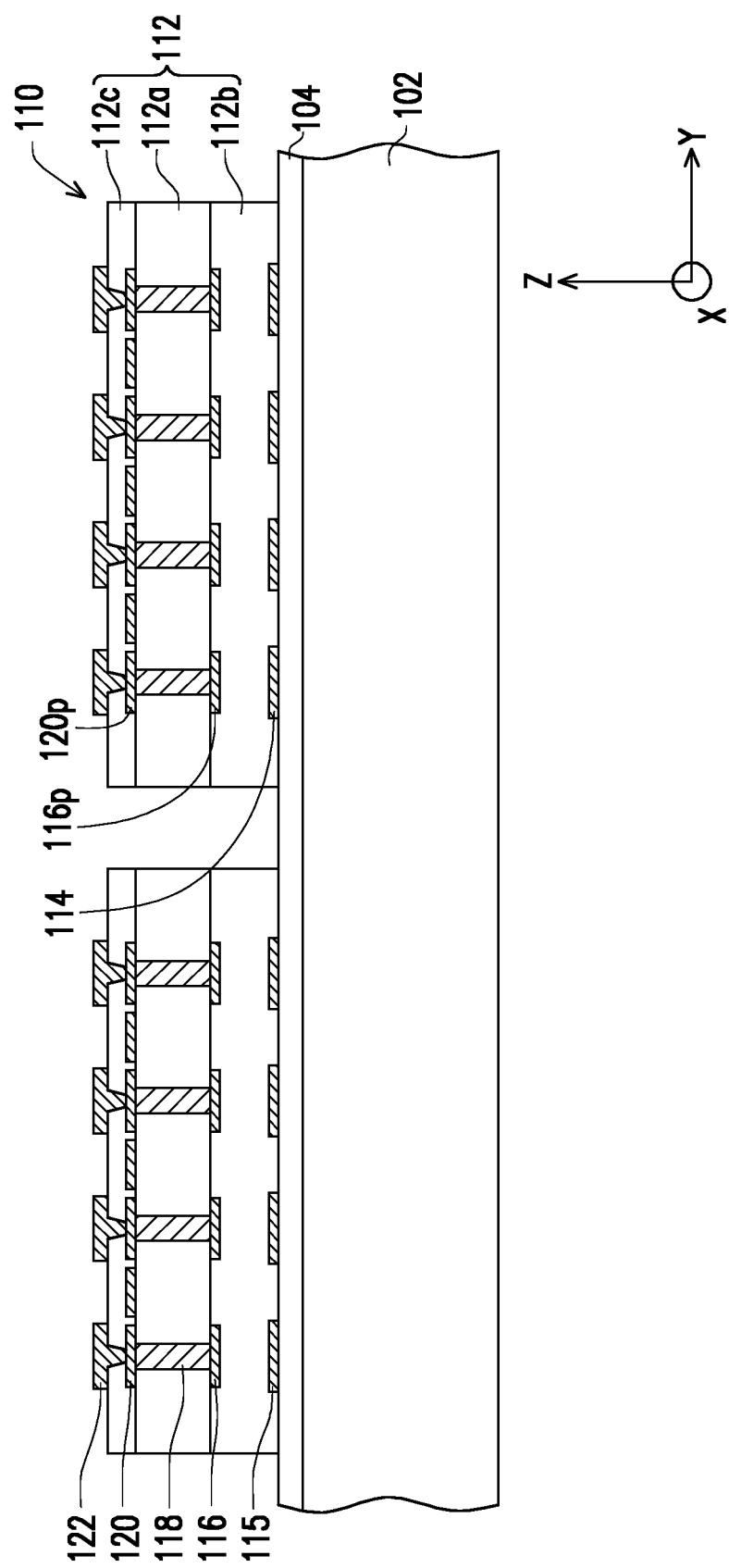
FIG. 1 to FIG. 9 are schematic cross-sectional views of various stages in a manufacturing method of a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 9 are schematic cross-sectional views of various stages in a manufacturing method of a package structure according to some exemplary embodiments of the present disclosure. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. FIGS. 1A and 1B are schematic top views illustrating the antenna patterns according to some exemplary embodiments of the present disclosure.

In FIG. 1 to FIG. 9, two dies are shown to represent plural dies of the wafer, and one or more package structures are shown to represent plural (semiconductor) package structures obtained following the (semiconductor) manufacturing method, the disclosure is not limited thereto.

Figure 1A:
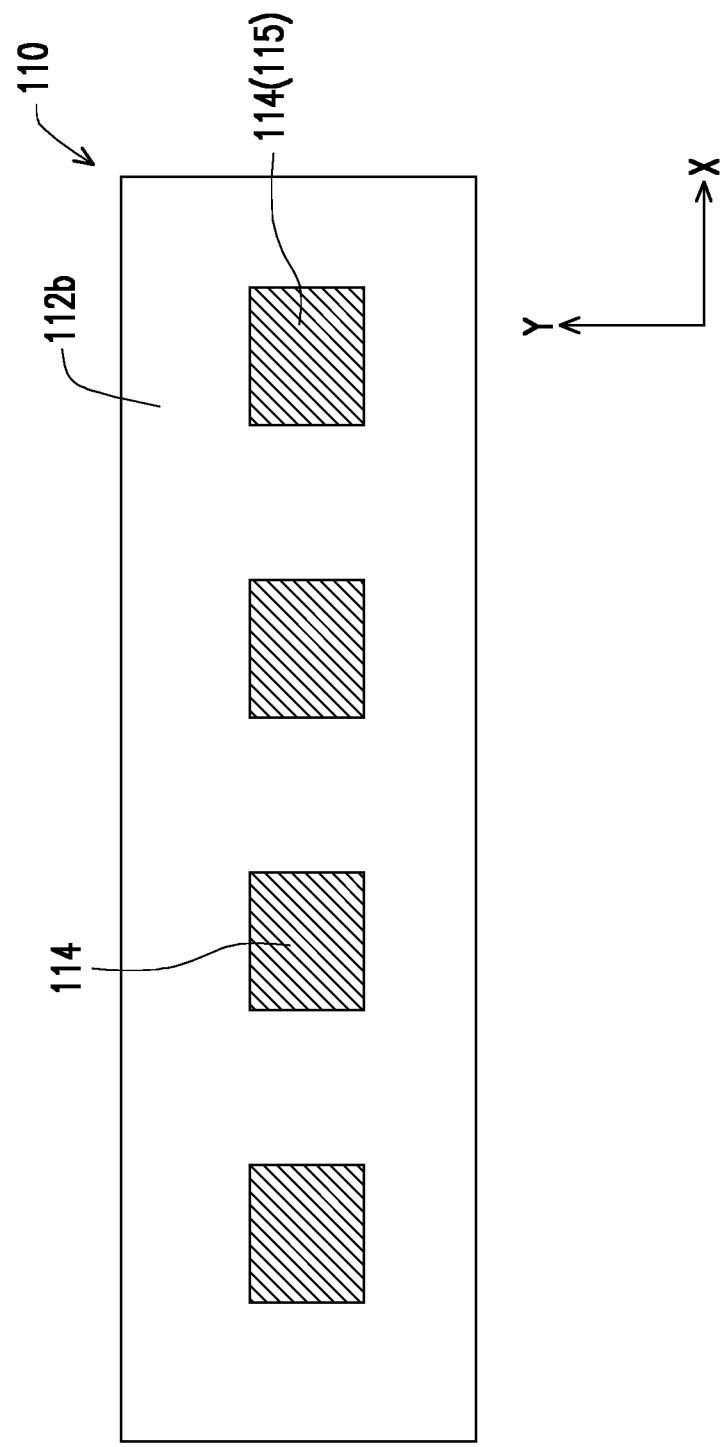
FIGS. 1A and 1B are schematic top views illustrating the antenna patterns according to some exemplary embodiments of the present disclosure.
Figure 1B:
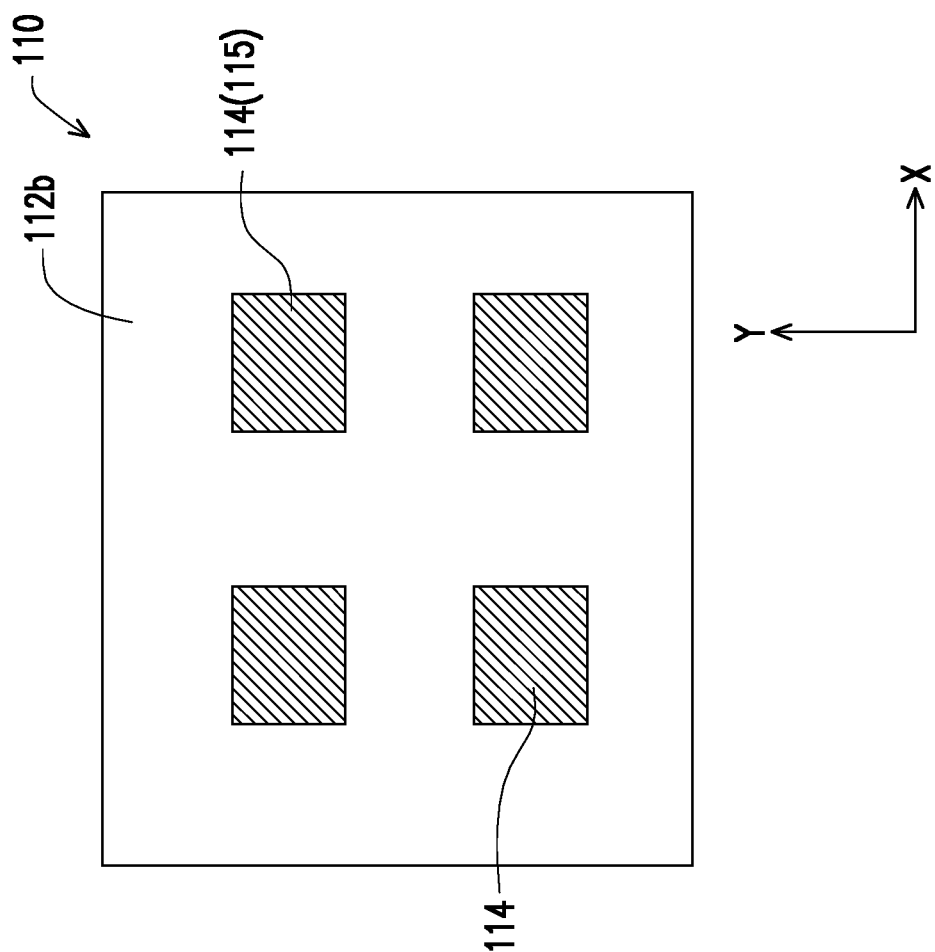

Referring to FIG. 1, in some embodiments, a carrier 102 is provided. In some embodiments, the carrier 102 is a glass carrier or any suitable carrier for the semiconductor manufacturing. Referring to FIG. 1, the carrier 102 is provided with a buffer layer 104 coated thereon. In some embodiments, the buffer layer 104 may include a die attach film made of a polymer-based dielectric material, such as epoxy adhesives. In some embodiments, the buffer layer 104 also includes a debonding layer made of any material suitable for bonding and debonding the carrier 102 from the above layer(s) or any wafer(s) disposed thereon. In some embodiments, the buffer layer 104 includes an epoxy-based thermal-release material, which loses its adhesive property when being heated, such as a light-to-heat-conversion (LTHC) release coating film. In alternative embodiments, the buffer layer 104 includes an ultra-violet (UV) glue, which loses its adhesive property when exposed to UV lights. In some embodiments, the buffer layer 104 may be dispensed as a liquid and cured, or may be a laminate film laminated onto the carrier 102, or the like. A top surface of the buffer layer 104, which is opposite to a bottom surface contacting the carrier 102, may have a high degree of coplanarity. In some embodiments, the buffer layer 104 is, a LTHC layer with good chemical resistance, and such layer enables room temperature debonding from the carrier 102 by applying laser irradiation.

In FIG. 1, in some embodiments, antenna substrate structure 110 is provided and disposed on the carrier 102. The antenna substrate structure 110 is attached to the carrier 102 through the buffer layer 104. In some embodiments, the antenna substrate structure 110 includes an antenna pattern 115 having multiple antenna elements 114 formed in a circuit substrate 112. In some embodiments, the circuit substrate 112 is a print circuit board (PCB), a flexible PCB or any suitable laminated circuit substrate. The circuit substrate 112 of the antenna substrate structure 110 includes a bottom laminated layer 112b on the carrier 102, a core layer 112a on the bottom laminated layer 112b, and a top laminated layer 112c on the core layer 112a. The bottom laminated layer 112b and the top laminated layer 112c may also be referred to as the build-up layers.

In some embodiments, the core layer 112a is or includes one or more layers of pre-preg (e.g., a fiberglass matrix injected with an epoxy resin, such as FR-4). For example, the pre-preg layer includes metal foils (e.g., copper foil) on both opposing surfaces, and through-holes are formed through the pre-preg layer and plated with a metal (e.g., copper) to form through vias 118. The metal foils on the two opposing surfaces may be etched or patterned using photolithographic and etch processes to form metallization layers 116, 120 respectively on the two opposing surfaces of the core layer 112a. In some embodiments, the metallization layers 116, 120 include metal lines. The through vias 118 of the core layer 112a electrically connect the metallization layers 116, 120 on opposing surfaces of the core layer 112a.

As illustrated in FIG. 1, the bottom laminated layer 112b and the top laminated layer 112c are formed on the metallization layers 116, 120 at the two opposite surfaces of the core layer 112a. The bottom laminated layer 112b and the top laminated layer 112c, in some examples, are Ajinomoto Build-up Films (ABF) or the like, and are laminated or formed by another process on the metallization layers 116, 120 of the core layer 112a.

In some embodiments, the bottom laminated layer 112b is formed with a metallic antenna pattern 115 of multiple antenna elements 114. In some embodiments, the material of the antenna elements 114 includes aluminum, titanium, copper, nickel, tungsten, and/or alloys thereof. In some embodiments, the antenna elements 114 may include patch antennas. For example, as shown in FIG. 1, the antenna elements 114 inlaid in the bottom laminated layer 112b are referred as broadside radiation antennas. In some embodiments, the antenna elements emit and/or receive the electromagnetic waves long the Z direction (polarizing in the Z direction). As the antenna substrate structure 110 is attached to the buffer layer 104 with the bottom laminated layer 112b facing the carrier 102, the antenna pattern 115 directly contacts the buffer layer 104.

FIGS. 1A and 1B are schematic top views showing the antenna patterns 115 of the antenna substrate structure 110 according to various embodiments. In some embodiments, the antenna elements 114 are arranged in arrays, such as the N×M array or N×N arrays (N, M are positive integers, N may or may not be equal to M). For example, in FIG. 1A, the antenna elements 114 are arranged as an 1×4 array, and in FIG. 1B, the antenna elements 114 are arranged as a 2×2 array. In some embodiments, the shape of the antenna elements 114 may be designed to be square, rectangular, hexagonal or any suitable polygonal shape according to the desired properties of the antenna. The size of the array for the antenna elements 114 can be designated and selected based on the desired properties.

As shown in FIG. 1, the metallization layer 116 located on the lower surface of the core layer 112a is formed with patterns 116p corresponding to the antenna pattern 115. As shown in FIG. 1A, in some embodiments, the locations of the patterns 116p in the metallization layer 116 vertically align with or at least overlap with the locations of the antenna elements 114. In some embodiments, the metallization layer 120 located on the upper surface of the core layer 112a is formed with patterns 120p. For example, some patterns 120p are connected with the through vias 118, and the through vias 118 are connected with the patterns 116p at locations vertically aligned with the antenna pattern 115. In some embodiments, the antenna elements 114 are electrically coupled with the metallization layer 116, and further with the metallization layer 120 and the through vias 118. In other words, the metallization layer 116 may serve as a ground plate, and the metallization layer 120 and the through vias 118 may serve as feed-lines for the antenna elements 114.

In FIG. 1, in some embodiments, conductive pillars 122 are formed on the top surface of the top laminated layer 112c and are connected with the metallization layer 120. For example, the conductive pillars 122 may be considered as contacts or contact terminals for the antenna substrate structure 110. In some embodiments, the material of the conductive pillars 122 includes copper, copper alloys or the like, and may be formed by electroplating, for example. In some embodiments, the conductive pillars 122 are electrically connected with the metallization layers 116, 120 and the through vias 118.

Figure 2:
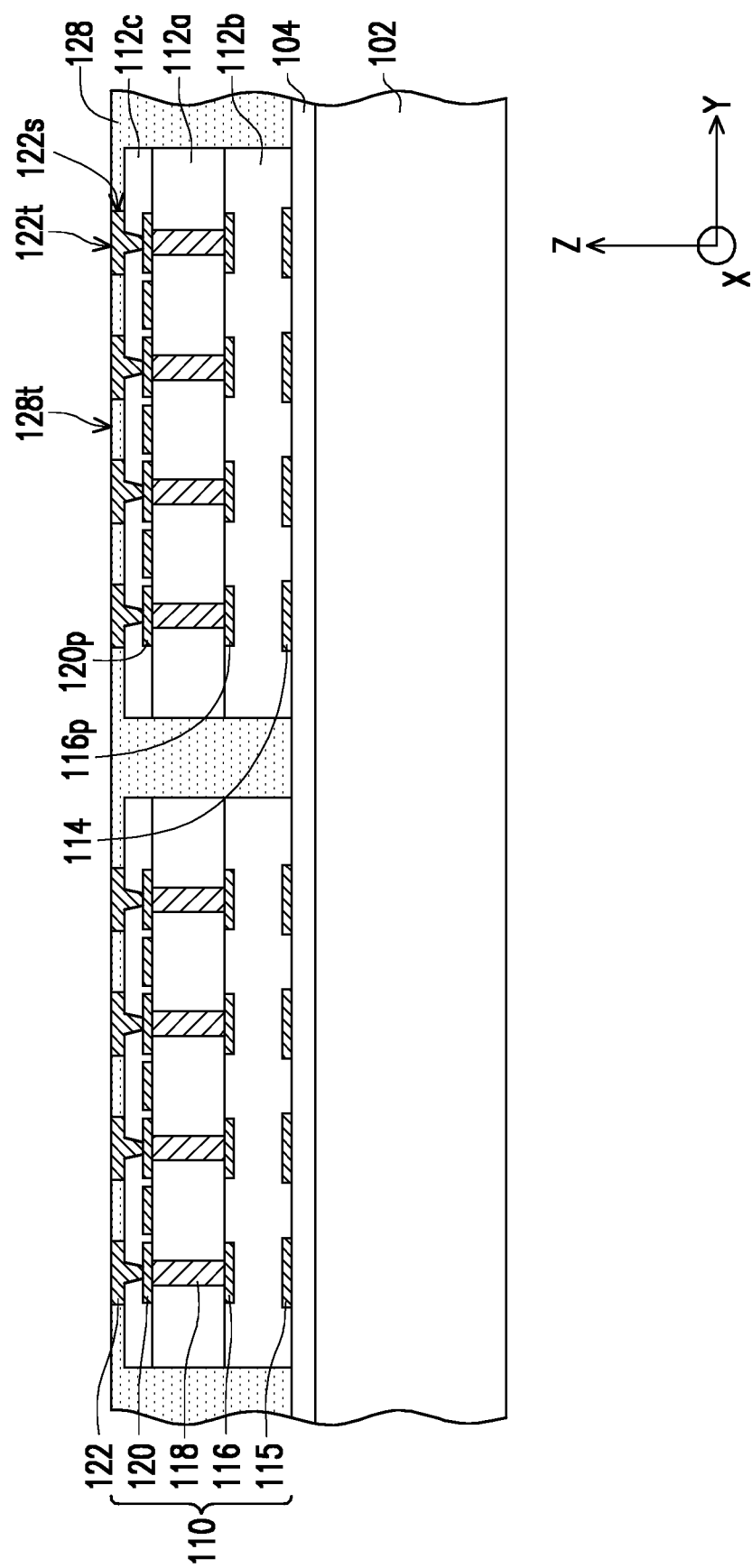

Referring to FIG. 2, in some embodiments, an insulating encapsulant 128 is formed over the carrier 102 and on the buffer layer 104. The insulating encapsulant 128 is formed to laterally wrap the antenna substrate structure 110 (i.e. cover sidewalls of the antenna substrate structure 110 and surround the antenna substrate structure 110). In some embodiments, the insulating encapsulant 128 is formed by a molding process or an over-molding process. For example, the insulating encapsulant 128 is formed over the top laminated layer 112c and the conductive pillars 122 to cover the conductive pillars 122, and then planarized to expose the conductive pillars 122. In some embodiments, sidewalls 122s of the conductive pillars 122 are surrounded and covered by the insulating encapsulant 128, and the top surfaces 122t of the conductive pillars 122 are exposed. In FIG. 2, in some embodiments, the top surfaces 122t of the conductive pillars 122 are substantially levelled with and coplanar to the top surfaces 128t of the insulating encapsulant 128. The planarizing process may include, for example, performing a mechanical grinding or polishing process or a chemical mechanical polishing (CMP) process to the over-molded insulating encapsulant. In some embodiments, during the planarizing process, portions of the conductive pillars 122 may also be removed. After the planarizing process, a cleaning step may be optionally performed, for example, to clean and remove the residue generated from the planarizing step.

In some embodiments, the insulating encapsulant 128, for example, is a molding compound made of a polymeric material (such as epoxy resins, phenolic resins, silicon-containing resins, or other suitable resins), a dielectric material having low permittivity (Dk) and low loss tangent (DO properties, or other suitable materials. In some embodiments, a dielectric material having low permittivity (Dk) and low loss tangent (DO properties refers to a dielectric material having a Dk value smaller than or substantially equal to 4, and a Df value smaller than or substantially equal to 0.009. Depending on the frequency range of the high-speed applications, suitable materials of the insulating encapsulant 128 may be selected based on the required electrical properties of the package structure 1. In some embodiments, the insulating encapsulant 128 may further include inorganic filler or inorganic compound (e.g. silica, clay, etc.) as additive added therein to optimize the coefficient of thermal expansion (CTE) of the insulating encapsulant 128. In some embodiments, the material of the insulating encapsulant 128 is different from the material of the core layer 112a.

Figure 3:
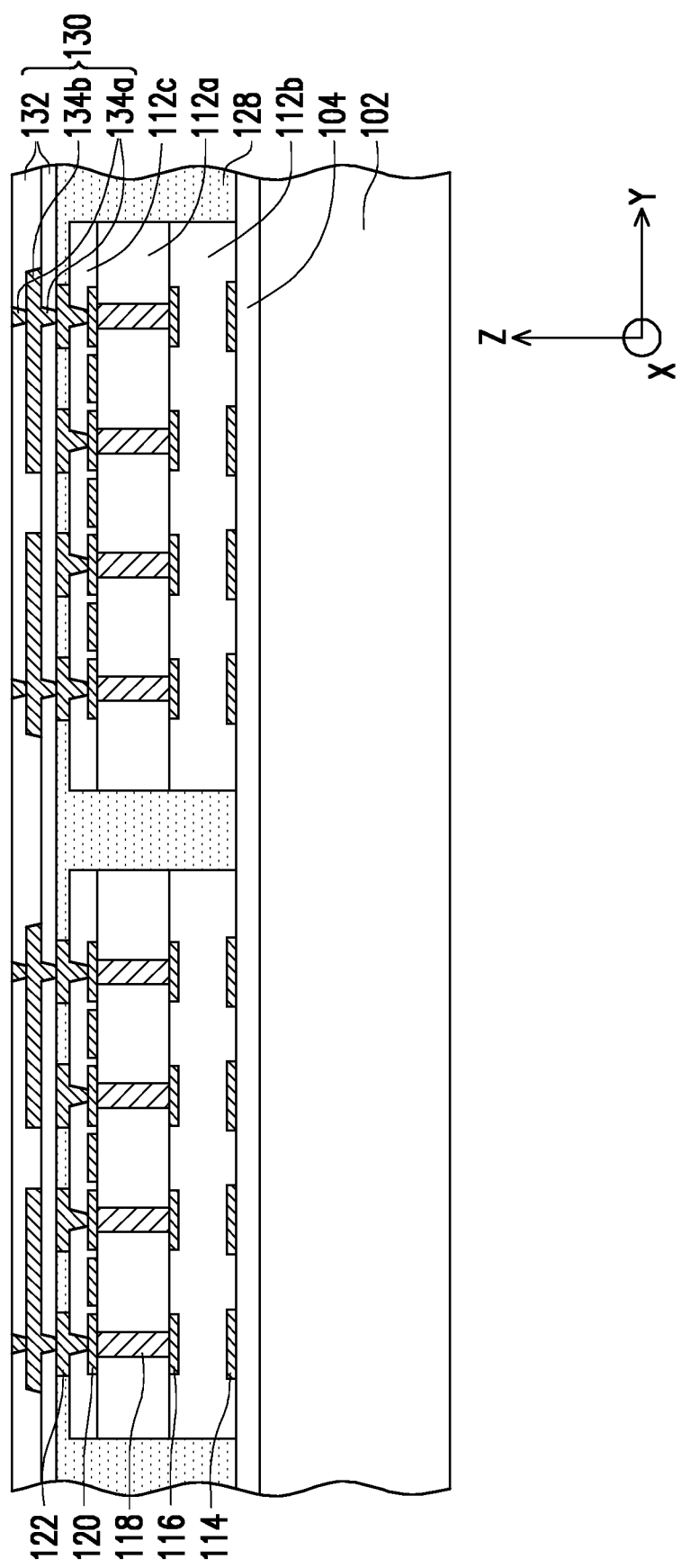

Referring to FIG. 3, in some embodiments, a redistribution layer 130 is formed on the insulating encapsulant 128 and the conductive pillars 122. In some embodiments, the redistribution layer 130 is formed on the top surface of the insulating encapsulant 128 and the top surfaces the conductive pillars 122. In some embodiments, the redistribution layer 130 is mechanically and electrically connected with the conductive pillars 122, as shown in FIG. 3.

In some embodiments, the formation of the redistribution layer 130 includes sequentially forming one or more dielectric layers 132 and one or more metallization layers 134 in alternation. The number of the dielectric layers and the metallization layers is determined according to the desired properties of the package structure. In some embodiments, the metallization layers 134 are illustrated to be embedded in the dielectric layers 132. In some embodiments, the metallization layer(s) includes metal vias 134a and metal routings 134b interconnected through the metal vias 134a. In some embodiments, the metallization layers 134 are electrically and mechanically connected to the conductive pillars 122 through one or more metal vias 134a. For example, in FIG. 3, the metal vias 134a of the lower metallization layer 134 are physically connected to the conductive pillars 122. The number of the metal vias 134a connects to each of the conductive pillars 122 may be one or more than one, according to the desired properties of the package structure. In some embodiments, the metal vias 134a in the topmost layer of the metallization layers 134 may be exposed by the topmost layer of the dielectric layers 132 for further connecting later-formed elements.

In some embodiments, the material of the dielectric layers 132 includes polyimide, epoxy resin, acrylic resin, phenol resin, benzocyclobutene (BCB), polybenzoxazole (PBO), or any other suitable poly-based dielectric material. The dielectric layers may be formed by deposition. In some embodiments, the material of the metallization layers 134 includes aluminum, titanium, copper, nickel, tungsten, and/or alloys thereof. The metallization layers 134 may be formed by electroplating or deposition.

Figure 4:
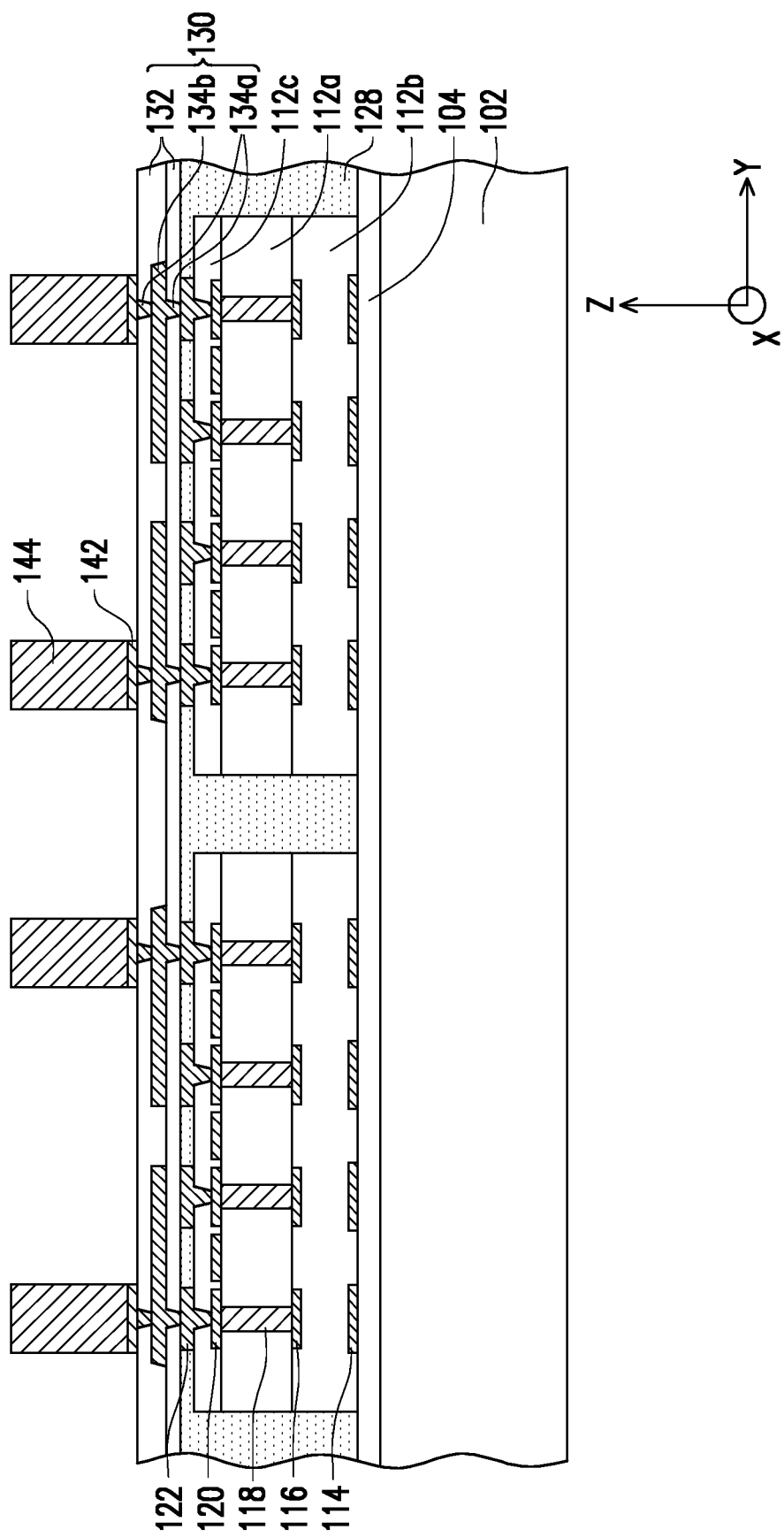

Referring to FIG. 4, in some embodiments, a seed layer 142 is formed on the redistribution layer 130 and conductive vias 144 are formed on the seed layer 142. In some embodiments, the conductive vias 144 may be through integrated fan-out (InFO) vias (TIV). The conductive vias 144 and the seed layer 142 are electrically connected with the redistribution layer 130. For simplification, only four conductive vias 144 are presented in FIG. 4 for illustrative purposes, however, the number of the conductive vias 144 may be selected based on the product requirements.

In some embodiments, the formation of the seed layer 142 includes blanketly forming one or more layers of metal or metal alloy materials over the redistribution layer 130 and covering the redistribution layer 130. In some embodiments, the seed layer 142 is a single layer or a composite layer comprising a plurality of sub-layers formed of different materials. In some embodiments, the seed layer 142 may include titanium, copper, molybdenum, tungsten, titanium nitride, titanium tungsten, combinations thereof, or the like. For example, the seed layer 142 may include a titanium layer and a copper layer over the titanium layer. The seed layer 142 may be formed by using, for example, chemical vapor deposition (CVD), sputtering, or physical vapor deposition (PVD).

In some embodiments, the formation of the conductive vias 144 includes forming a patterned photoresist layer (not shown) with opening on the seed layer 142, where portions of the seed layer 142 are exposed by the openings of the patterned photoresist layer. Later, the conductive vias 144 are formed within the openings of the patterned photoresist layer respectively. In some embodiments, the conductive vias 144 are formed by forming a metallic material filling the openings to form the conductive vias 144 by plating or deposition. In some embodiments, the material of the conductive vias 144 may include a metal material such as copper or copper alloys, or the like.

After the conductive vias 144 are formed, the patterned photoresist layer is removed by performing an ashing or stripping process using an oxygen plasma, for example. In some embodiments, during the removal of the patterned photoresist layer, the uncovered seed layer 142 is also removed. In some embodiments, following the removal of the patterned photoresist layer, the seed layer 142 that is not covered by the conductive vias 144 is removed. In some embodiments, the seed layer 142 is etched off by using the conductive vias 144 as an etching mask. In some embodiments, the etching process may include a dry etching process or a wet etching process. In some embodiments, the remained portions of the seed layers 142 are located below the conductive vias 144 and are mechanically and electrically connected to the respective conductive vias 144.

Figure 5:
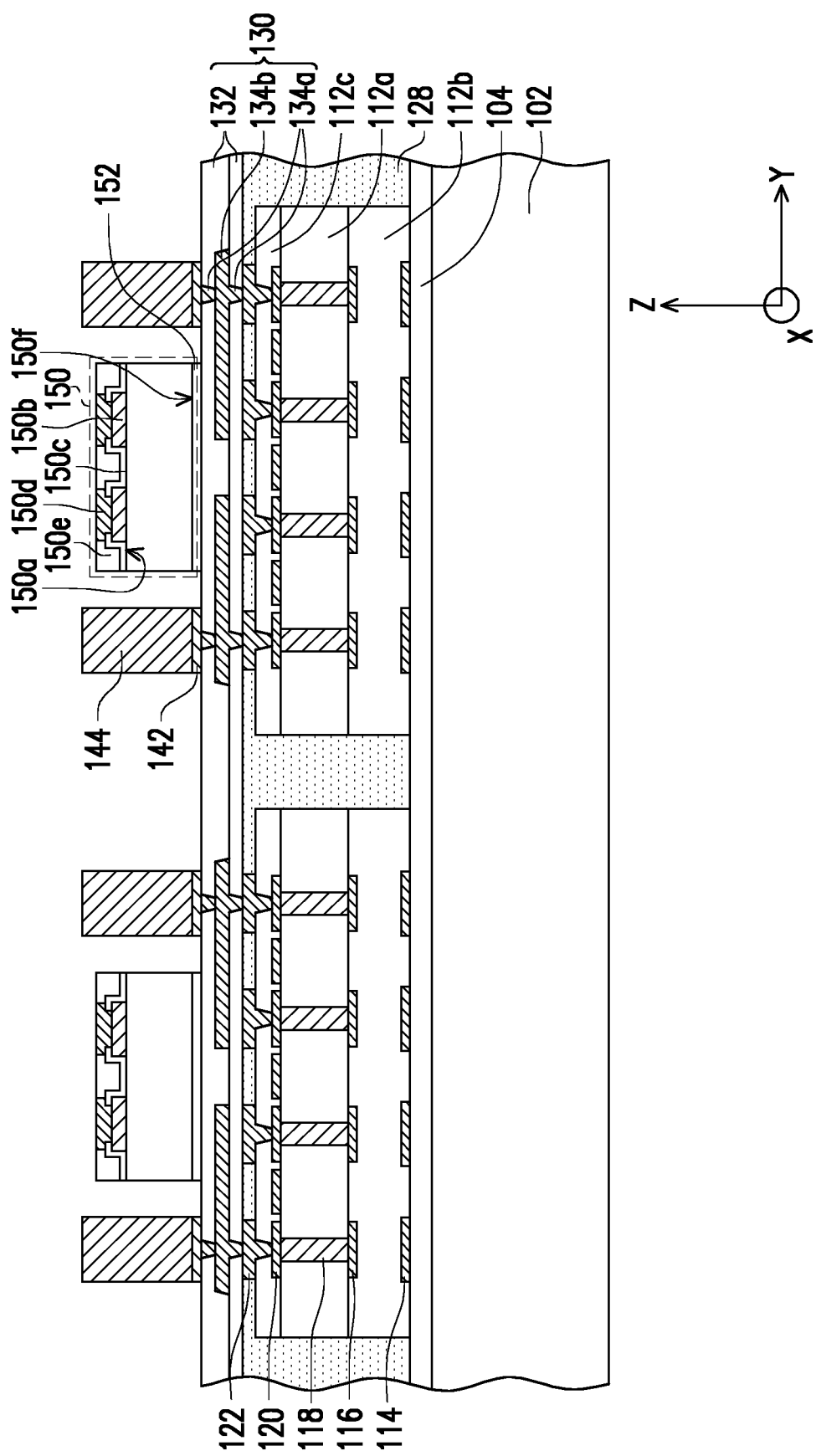

Referring to FIG. 5, in some embodiments, semiconductor dies 150 are provided onto the redistribution layer 130. In some embodiments, the semiconductor die 150 is disposed on the redistribution layer 130 through a die attach film 152. In some embodiments, the die attach film 152 may be applied to a backside surface 150f of the semiconductor die 150, then the backside surface 150f of the semiconductor die 150 is attached to the redistribution layer 130 by placing the die attach film 152 between the semiconductor die 150 and the redistribution layer 130. With the die attach film 152, a better adhesion between the semiconductor die 150 and the redistribution layer 130 is ensured. For example, in FIG. 5, the redistribution layer 130 is located at the backside surface 150f of the semiconductor die 150, so that the redistribution layer 130 may be referred as a back-side redistribution layer relative to the semiconductor dies 150. In some embodiments, the conductive vias 144 surround the positioning location(s) of the semiconductor die(s) 150.

In some embodiments, the semiconductor die 150 includes an active surface 150a and the backside surface 150f opposite to the active surface 150a. Also, the semiconductor die 150 includes pads 150*b* distributed on the active surface 150*a*, a passivation layer 150*c* covering the active surface 150*a* and exposing portions of the pads 150*b*, conductive pillars 150*d* connected to the exposed portions of the pads 150*b*, a protection layer 150*e* covering the passivation layer 150*c* but exposing the conductive pillars 150*d*.

Referring to FIG. 5, the pads 150*b* are partially exposed by the passivation layer 150*c*, and the conductive pillars 150*d* are disposed on and electrically connected to the pads 150*b*. The protection layer 150*e* covers the passivation layer 150*c* and the conductive pillars 150*d*.

In some embodiments, the pads 150*b* may be aluminum pads or other suitable metal pads. In some embodiments, the conductive pillars 150*d* are copper pillars, copper alloy pillars or other suitable metal pillars, for example. In some embodiments, the passivation layer 150*c* and/or the protection layer 150*e* may be a polybenzoxazole (PBO) layer, a polyimide (PI) layer or other suitable polymers. In some alternative embodiments, the passivation layer 150*c* and/or the protection layer 150*e* may be made of inorganic materials, such as silicon oxide, silicon nitride, silicon oxynitride, or any suitable dielectric material. In certain embodiments, the materials of the passivation layer 150*c* and the protection layer 150*e* may be the same or different.

In some embodiments, the semiconductor die 150 described herein may be referred as a chip or an integrated circuit (IC). In certain embodiments, the semiconductor die 150 includes one or more digital chips, analog chips or mixed signal chips, such as application-specific integrated circuit ("ASIC") chips, sensor chips, wireless and radio frequency (RF) chips, memory chips, logic chips or voltage regulator chips. In certain embodiments, the semiconductor die 150 may further include additional semiconductor chip(s) of the same type or different types. In some embodiments, the semiconductor die 150 includes at least a radio frequency integrated circuit (RFIC) or a RF chip configured to process and/or generate the RF signals received and/or received from the antenna elements 114.

Figure 6:
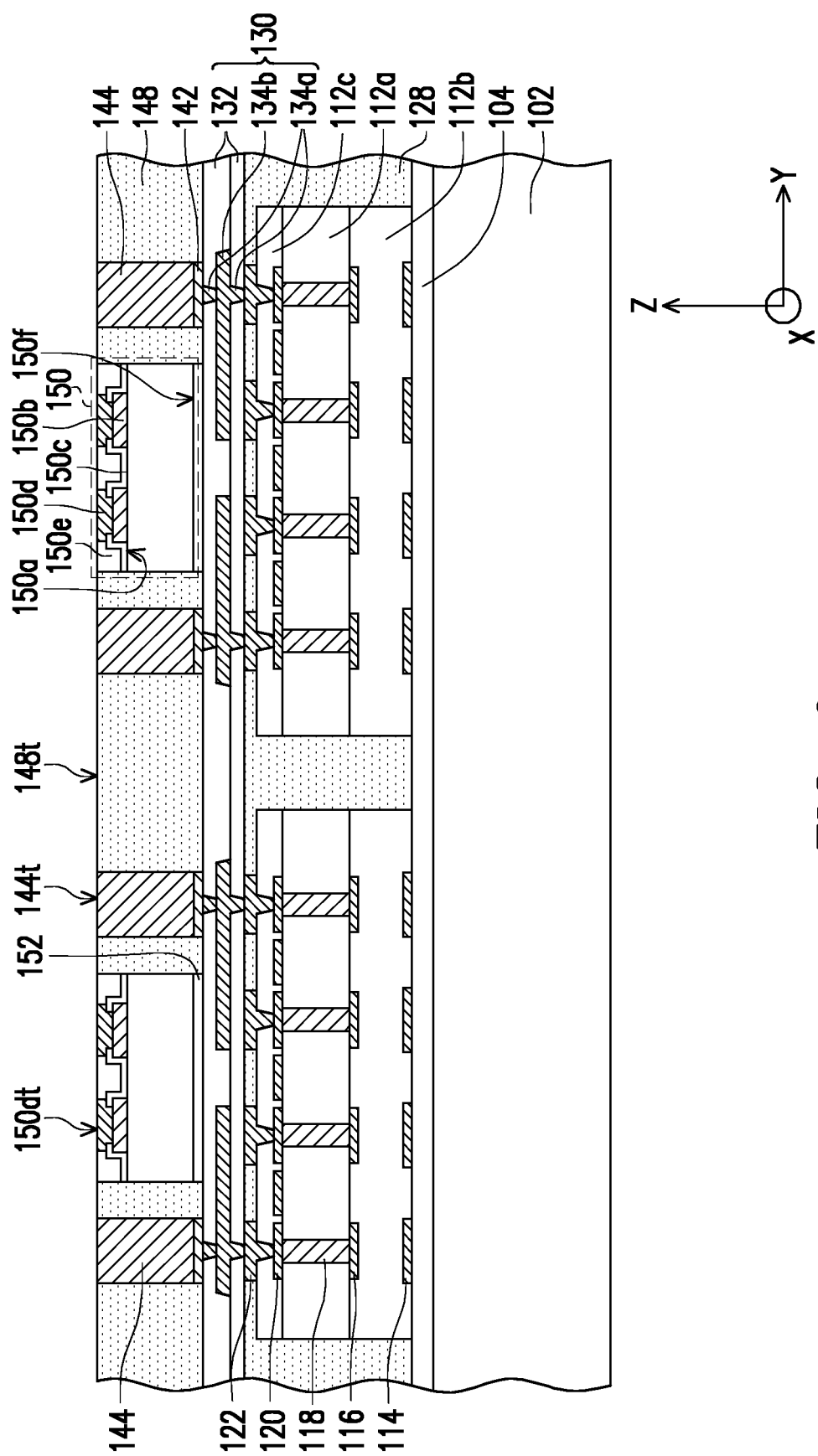

Referring to FIG. 6, in some embodiments, an insulating encapsulant 148 is formed to laterally wrap the conductive vias 144 and the semiconductor dies 150 (i.e. cover side walls of the conductive vias 144 and the semiconductor dies 150 and surround the conductive vias 144 and the semiconductor dies 150). The formation methods and materials of the insulating encapsulant 148 are similar to the methods and materials for forming the insulating encapsulant 128 as described in FIG. 2, and shall not be repeated herein.

In some embodiments, the insulating encapsulant 148 at least fills up the gaps between the conductive vias 144, the gaps between the conductive vias 144 and the semiconductor die 150, the gaps between the semiconductor dies 150, and covers the topmost layer of the dielectric layers 132 not covered by the conductive vias 144 and the semiconductor dies 150. In some embodiments, a material of the insulating encapsulant 148 may be substantially the same as the material of the insulating encapsulant 128. In an alternative embodiment, the material of the insulating encapsulant 148 may be different from the material of the insulating encapsulant 128.

Similarly, in some embodiments, the insulating encapsulant 148 may be planarized until the conductive vias 144 and the conductive pillars 150*d* of the semiconductor dies 150 are exposed from the insulating encapsulant 148. In some embodiments, as shown in FIG. 6, after the planarization, top surfaces 144*t* of the conductive vias 144 and top surfaces 150*dt* of the conductive pillars 150*d* of the semiconductor dies 150 become substantially levelled with and coplanar with the top surface 148*t* of the insulating encapsulant 148. That is, for example, the top surfaces of the conductive pillars 150*d* and the protection layer 150*e* of the semiconductor die 150 and the top surfaces 144*t* of the conductive vias 144 are levelled with the top surface 148*t* of the insulating encapsulant 148.

Figure 7:
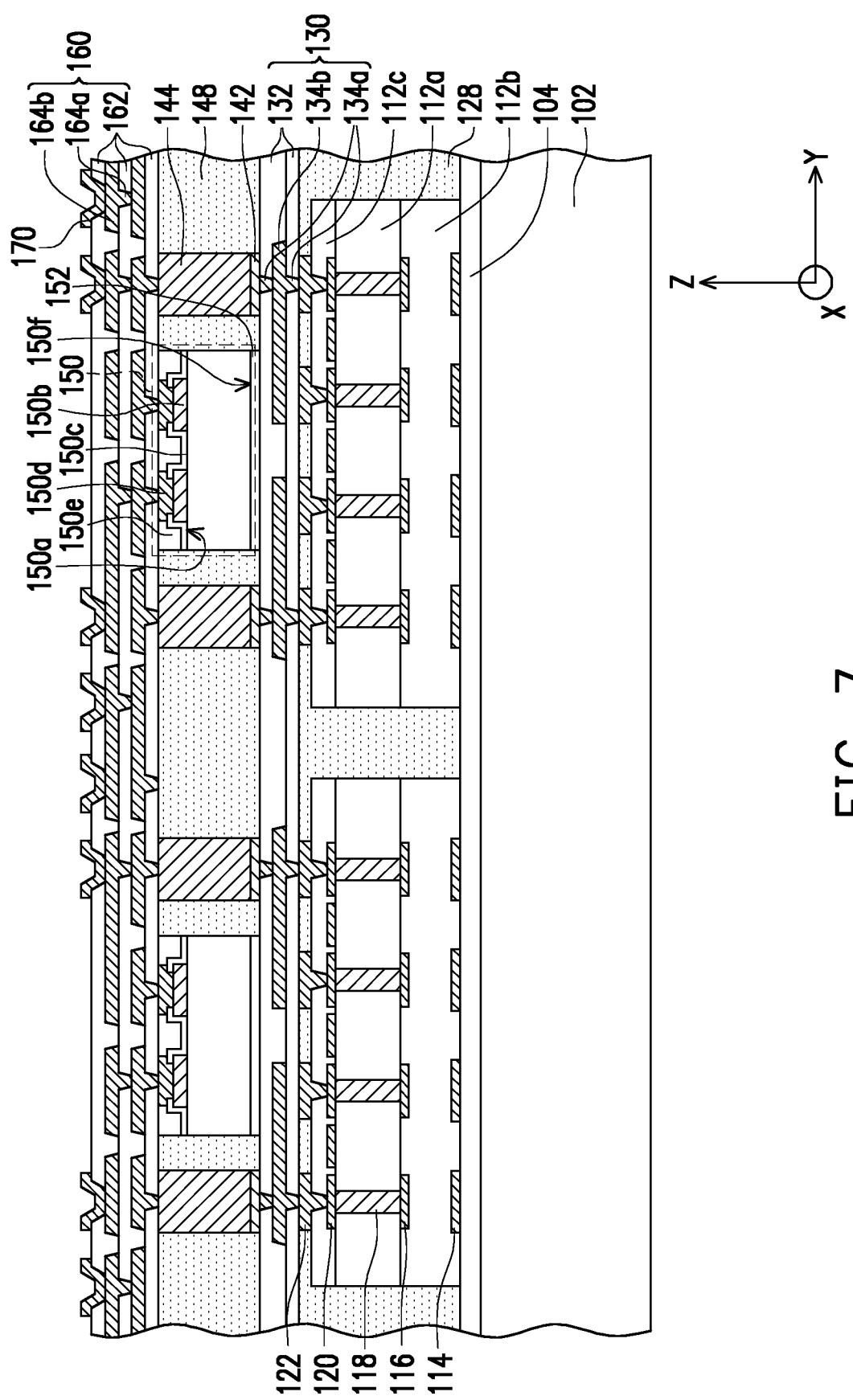

Referring to FIG. 7, in some embodiments, a redistribution layer 160 is formed on the insulating encapsulant 148. In certain embodiments, the redistribution layer 160 is formed over and covers the conductive vias 144, the semiconductor dies 150 and the insulating encapsulant 148. As shown in FIG. 7, the semiconductor dies 150 and the conductive vias 144 are sandwiched between the redistribution layer 130 and the redistribution layer 160, and the conductive vias 144 electrically connect the redistribution layer 130 and the redistribution layer 160. In some embodiments, the redistribution layer 160 is electrically connected with the semiconductor dies 150 and the conductive vias 144, as shown in FIG. 7. In some embodiments, the semiconductor dies 150 are electrically connected with the redistribution layer 160 and the redistribution layer 130 through the conductive vias 144 and the seed layer 142. The redistribution layer 160 and the redistribution layer 130 function as electrical connection structures. In some embodiments, the redistribution layer 160 is electrically connected to the antenna substrate structure 110 through the conductive vias 144, the seed layer 142, the redistribution layer 130. In some embodiments, the redistribution layer 160 is electrically connected to the semiconductor die 150 through the conductive pillars 150*d*.

In some embodiments, the redistribution layer 160 includes one or more dielectric layers 162 and one or more metallization layers 164 arranged in alternation. In certain embodiments, one or more the metallization layers 164 may include metal vias 164*a* and metal routings 164*b* mechanically and electrically interconnected through the metal vias 164*a*. In some embodiments, the metallization layer 164 is sandwiched between the dielectric layers 162, but the top surface of the metallization layer 164 is exposed by the topmost layer of the dielectric layers 162 and the lowest layer of the metallization layer 164 is exposed by the lowest layer of the dielectric layers 162 to connect the conductive vias 144 and the conductive pillars 150*d*. The number of the dielectric layers 162 and the metallization layers 164 included in the redistribution layer 160 is determined according to the desired properties of the package structure. In some embodiments, the materials of the dielectric layers 132 and the dielectric layers 162 may be the same or different. In some embodiments, the materials of the metallization layers 164 and the metallization layers 134 may be the same or different.

Referring to FIG. 7, in some embodiments, under-ball metallurgy (UBM) patterns 170 may be formed on the top surface of the topmost layer of the metallization layers 164 exposed by the topmost layer of the dielectric layers 162 for electrically connecting with conductive elements (such as conductive balls) or other additional semiconductor element (e.g., passive components or active components)). In some embodiments, the materials of the UBM patterns 170 may include copper, nickel, titanium, tungsten, or alloys thereof or the like, and may be formed by an electroplating process, for example. The number of the UBM patterns 170 corresponds to the number of portions of the top surface of the topmost layer of the metallization layers 164 exposed by the topmost layer of the dielectric layers 162.

Figure 8:
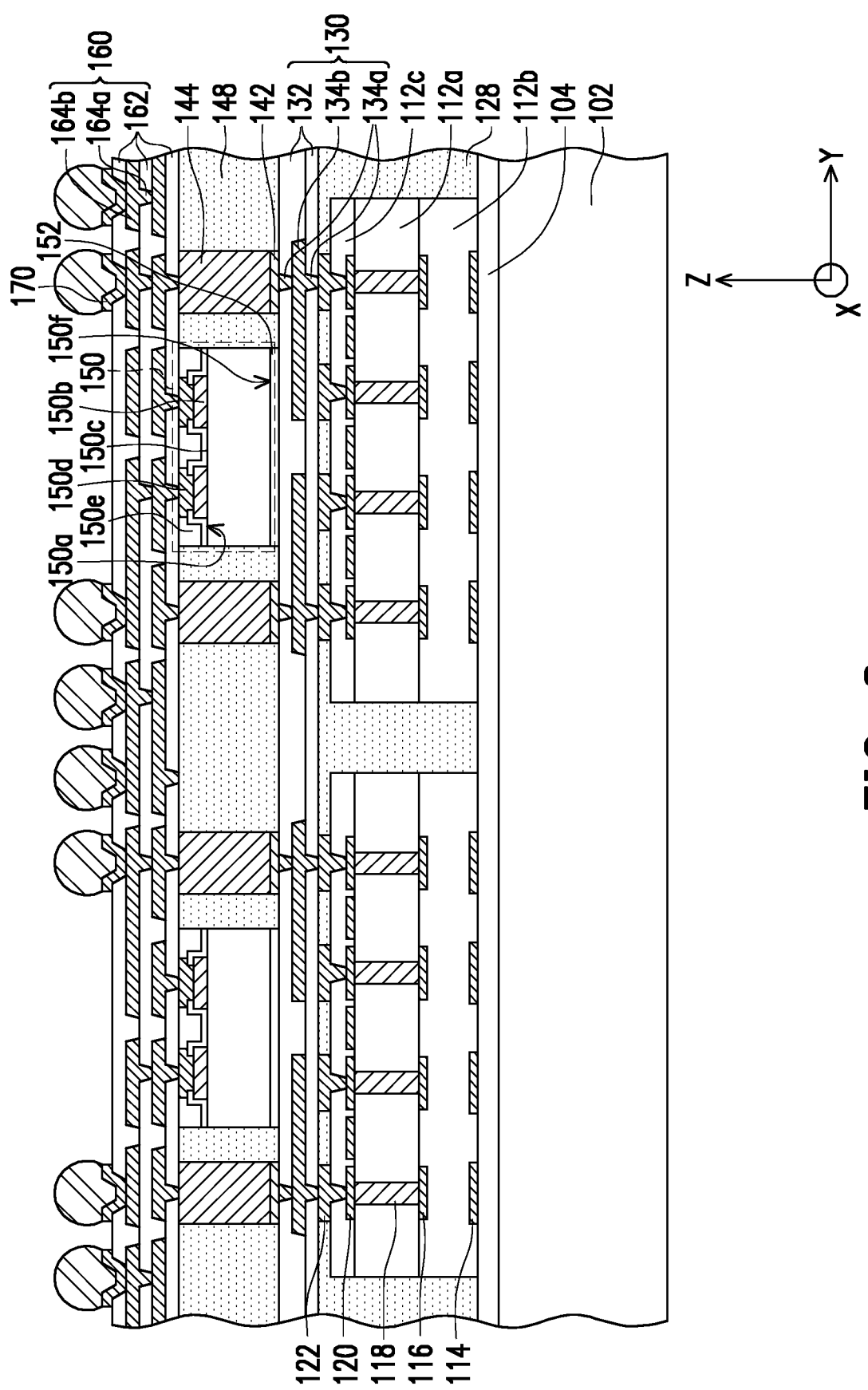

Referring to FIG. 8, after the redistribution layer 160 and the UBM patterns 170 are formed, a plurality of conductive elements 180 are formed on the redistribution layer 160 and are electrically connected to the redistribution layer 160 through the UBM patterns 170. In some embodiments, the redistribution layer 160 is located between the insulating encapsulant 148 and the conductive elements 180, between the semiconductor die 150 and the conductive elements 180, and between the conductive vias 144 and the conductive elements 180. As shown in FIG. 8, the conductive elements 180 are mechanically and electrically connected to the UBM patterns 170. In some embodiments, the conductive elements 180 may be disposed on the UBM patterns 170 by ball placement process or reflow process. In some embodiments, the conductive elements 180 are, for example, solder balls or ball grid array (BGA) balls.

In some embodiments, the conductive elements 180 are electrically connected to the redistribution layer 160 through the UBM patterns 170. In some embodiments, some of the conductive elements 180 are electrically connected to the semiconductor die 150 through the UBM patterns 170, the redistribution layer 160 and the conductive pillars 150*d*. In some embodiments, the conductive elements 180 are electrically connected to some of the conductive vias 144 through the UBM patterns 170 and the redistribution layer 160. In some embodiments, some of the conductive elements 180 are electrically connected to the redistribution layer 130 through the UBM patterns 170, the redistribution layer 160, and some of the conductive vias 144. In some embodiments, the conductive elements 180 are electrically connected to the antenna substrate structure 110 through the UBM patterns 170, the redistribution layer 160, some of the conductive vias 144, and the redistribution layer 130.

Figure 9:
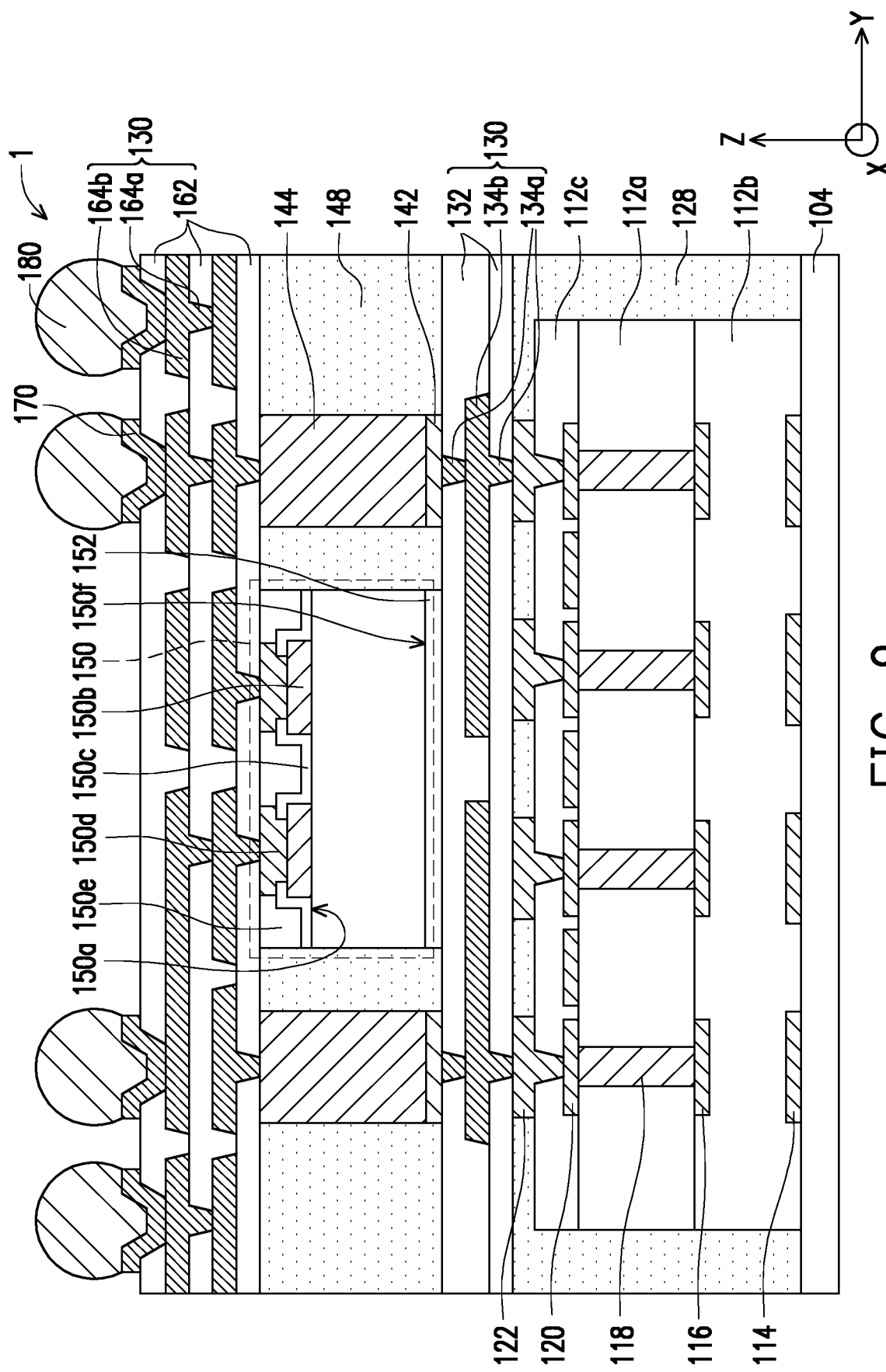

Referring to FIG. 9, in some embodiments, the carrier 102 is debonded from the antenna substrate structure 110 and the insulating encapsulant 128. In some embodiments, the antenna substrate structure 110 and the insulating encapsulant 128 are easily separated from the carrier 102 due to the buffer layer 104. In some embodiments, the carrier 102 is detached from the antenna substrate structure 110 and the insulating encapsulant 128 through a debonding process, and the carrier 102 is removed. The antenna substrate structure 110 and the insulating encapsulant 128 are covered by the buffer layer 104. As shown in FIG. 9, the bottom surfaces of the insulating encapsulant 128 and the antenna substrate structure 110 are covered by the buffer layer 104. That is, the bottom surfaces of the antenna elements 114 are not covered by the insulating encapsulant 128. In alternative embodiments, the carrier 102 is detached from the antenna substrate structure 110 and the carrier 102 and the buffer layer 104 are removed, so that the antenna substrate structure 110 and the insulating encapsulant 128 are exposed.

In some embodiments, the debonding process is a laser debonding process. During the debonding step, a holding device may be utilized to secure the package and the package may be held by the side where the conductive elements 180 reside. In some embodiments, the holding device may be an adhesive tape, a carrier film or a suction pad (not shown). Continued on FIG. 9, in some embodiments, a dicing process is performed to cut the wafer into individual and separated package structure 1. In some embodiments, the dicing process is a wafer dicing process including mechanical blade sawing or laser cutting or any suitable dicing process.

The package structure 1 comprises an antenna substrate structure 110, and a semiconductor die 150, wherein semiconductor die 150 is placed on the antenna substrate structure 110. The antenna substrate structure 110 comprises antenna elements 114 placed on the bottom laminated layer 112*b*. The semiconductor die 150 is covered by the insulating encapsulant 148. The semiconductor die 150 electrically connects to the antenna substrate structure 110 through the conducive pillars 150*d*, the redistribution layer 160, the conductive vias 144, and the redistribution layer 130. Since the antenna elements 114 are arranged on the antenna substrate structure 110, by arranging the antenna substrate structure 110 on the InFO package comprising the semiconductor die 150, the conductive vias 144, the thickness of the InFO package may be reduced and cost of production may also be reduced.

Figure 10A:
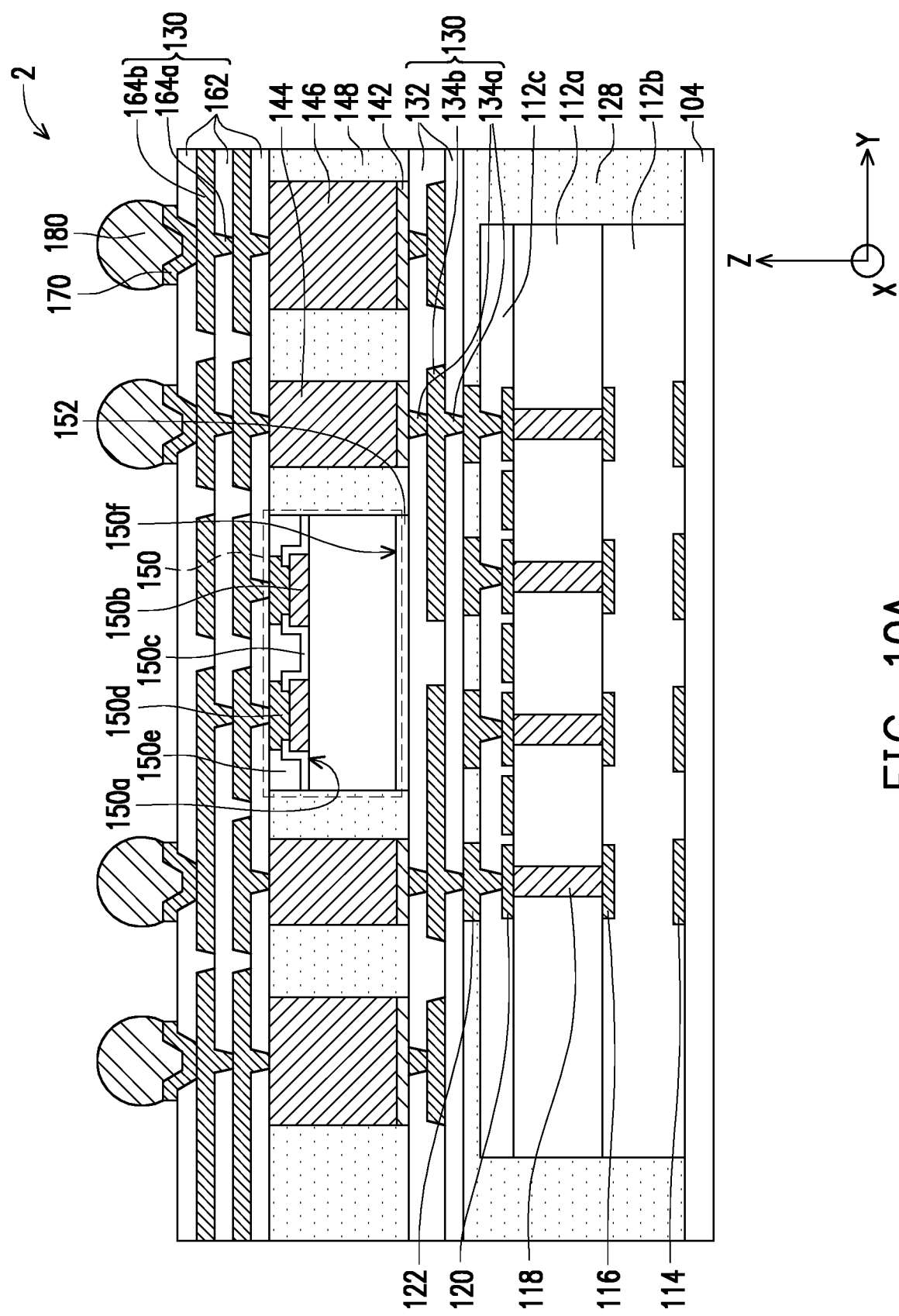
FIG. 10A is a schematic cross-sectional view of a package structure according to some exemplary embodiments of the present disclosure.

Referring to FIG. 10A, the package structure 2 is similar to the package structure 1 illustrated in FIG. 9. The difference between the package structure 2 and the package structure 1 lies in that the package structure 2 further includes conductive vias 146 being formed on the seed layer 142 and disposed aside the semiconductor die 150. The conductive vias 146 form dipole antennas. The formation method and material of the conductive vias 146 are similar to the process and materials for forming the conductive vias 144 as described in FIG. 4. As shown in FIG. 10A, when the patterned photoresist layer is formed on the seed layer 142, portions of the seed layer 142 are exposed by the openings of the patterned photoresist layer. Later, the conductive vias 144 and 146 are formed within the openings of the patterned photoresist layer respectively. In some embodiments, the conductive vias 144 and 146 are formed by plating process or any other suitable method, which the plating process may include electroplating or electroless plating, or the like. In some embodiments, the conductive vias 144 and 146 are formed by forming a metallic material filling the openings to form the conductive vias 144 and 146 by plating or deposition. In some embodiments, the material of the conductive vias 144 and 146 may include a metal material such as copper or copper alloys, or the like.

After the conductive vias 144 and 146 are formed, the patterned photoresist layer is removed by performing an ashing or stripping process using an oxygen plasma, for example.

In some embodiments, following the removal of the patterned photoresist layer, the seed layer 142 that is not covered by the conductive vias 144 or 146 are removed. In some embodiments, the seed layer 142 is etched off by using the conductive vias 144 or 146 as etching masks. In some embodiments, the etching process includes a dry etching process or a wet etching process. In some embodiments, the remained portions of the seed layers 142 are located below the conductive vias 144 and 146 and are mechanically and electrically connected to the conductive vias 144 and 146.

Figure 10B:
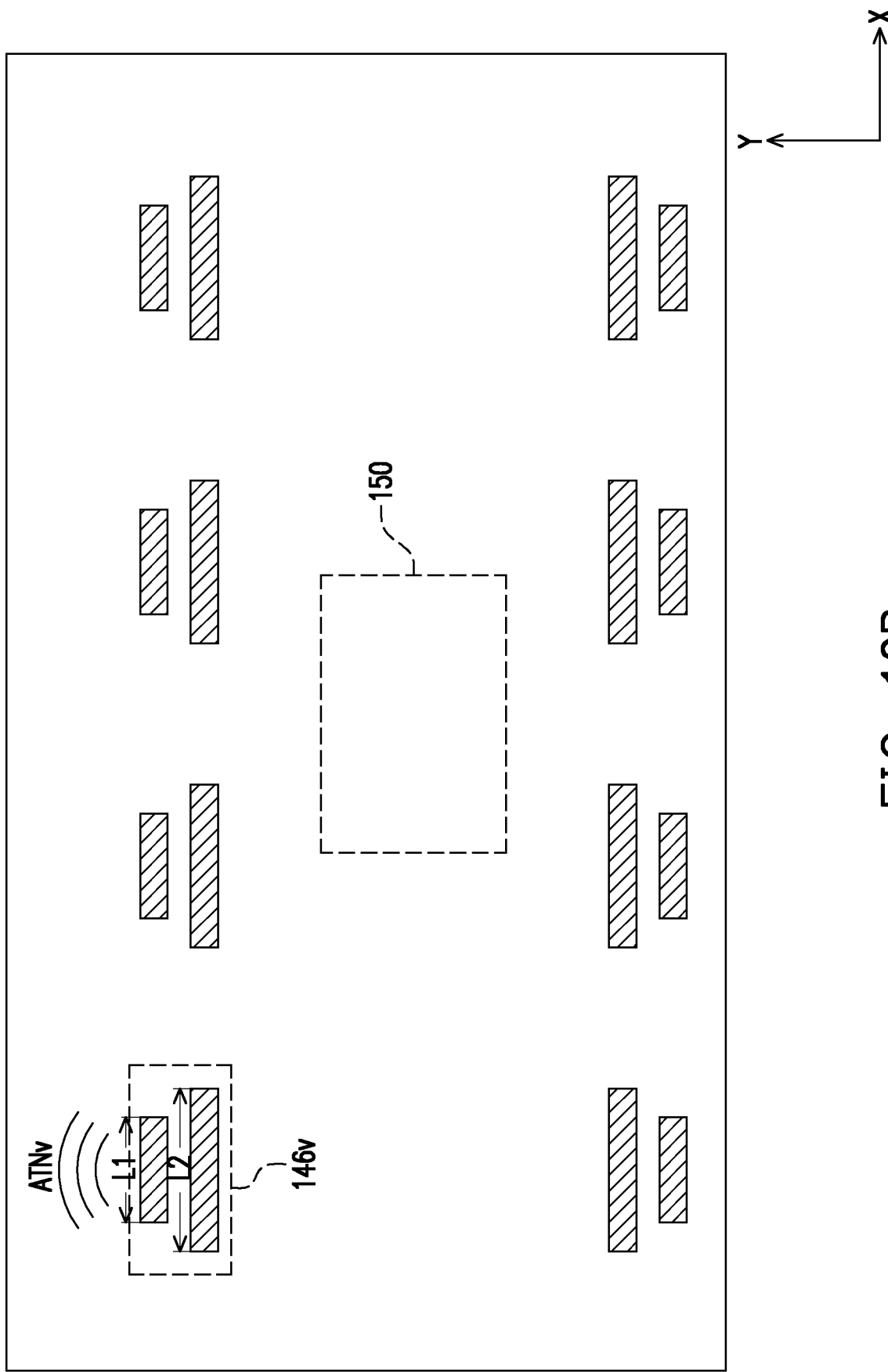
FIG. 10B is a schematic top view illustrating a relative position between antennas and a semiconductor chip depicted in FIG. 10A.
Figure 10C:
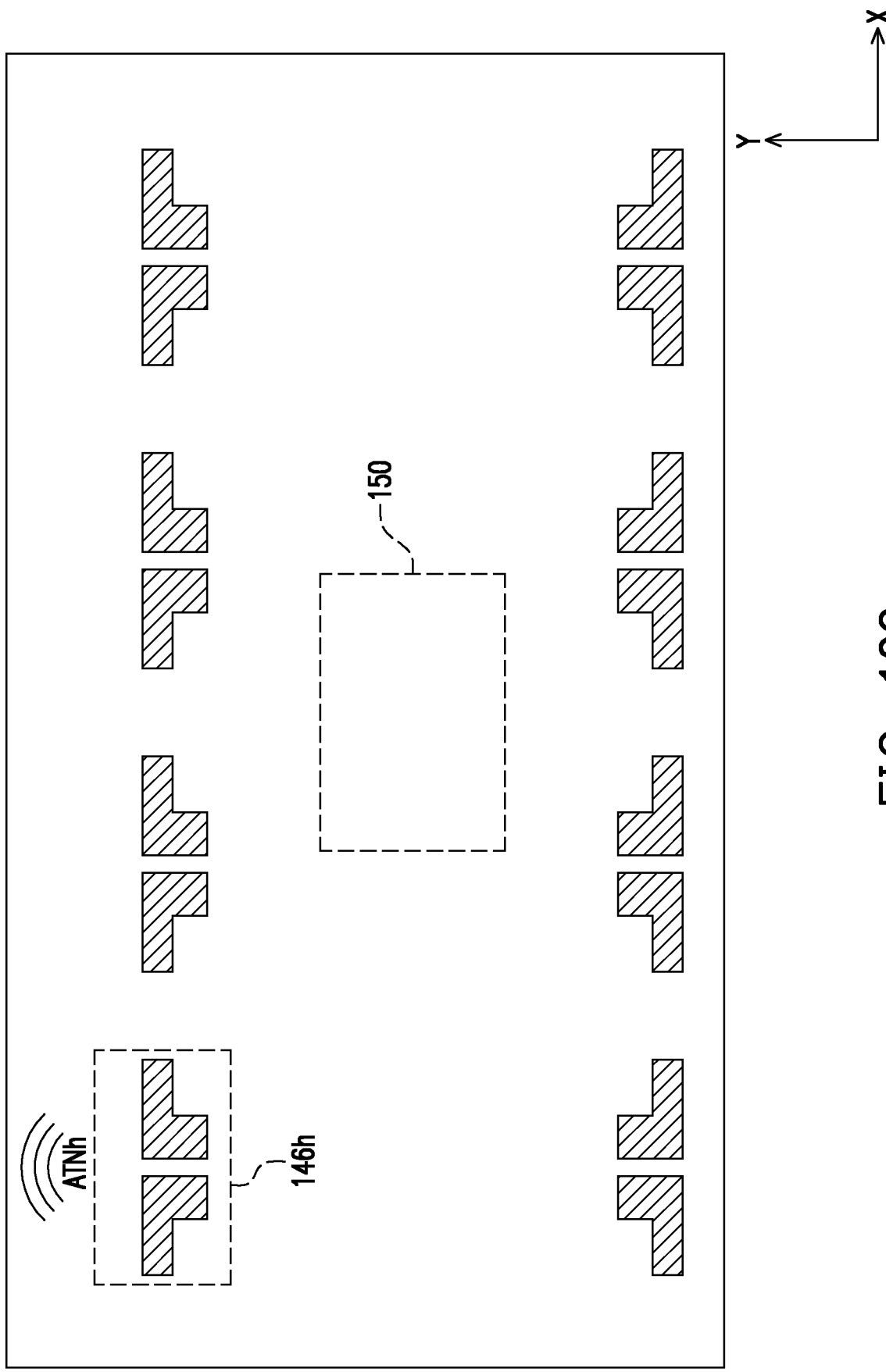
FIG. 10C is a schematic top view illustrating a relative position between antennas and a semiconductor chip depicted in FIG. 10A.

Referring to FIGS. 10B and 10C, in some embodiments, the conductive vias 146 include conductive vias 146*v* and/or 146*h*. The conductive vias 146*v* constitute the antenna element ATNv, which form a dipole antenna, where a part of the redistribution layer 130 or a part of the redistribution layer 160 serves as a feed line of the antenna element ATNv, and the other one is electrically grounded or floated. The conductive vias 146*h* constitute the antenna element ATNh, which form a dipole antenna, where a part of the redistribution layer 130 or a part of the redistribution layer 160 serves as a feed line of the antenna element ATNh, and the other one is electrically grounded or floated.

For example, as shown in FIGS. 10A, 10B and 10C, the package structure 2 may include one or more antenna elements ATNv formed by the conductive vias 146*v*, as shown in FIG. 10B, and one or more antenna elements ATNh formed by the conductive vias 146*h*, as shown in FIG. 10C. The antenna elements ATNv are referred as an end-fire radiation antenna with a polarization direction, for example, along a direction Y, as shown in FIG. 10B. The antenna elements ATNh are referred as an end-fire radiation antenna with a polarization direction, for example, along a direction Y, as shown in FIG. 10C). That is, the polarization of electromagnetic waves emitted from the antenna element is perpendicular to emitting surface(s) of the antenna element.

Referring to FIGS. 10A and 10B, in some embodiments, the antenna elements ATNv are configured as two strips arranged parallel with different lengths and are arranged beside the semiconductor die 150. The two conductive vias 146v used to constitute one antenna element ATNv are in rectangular shape. Along the X direction, one of the two conductive vias 146v used to constitute one antenna element ATNv has a length L1 and the other one has a length L2, where the conductive via 146v having the length L2 is between the semiconductor die 150 and the conductive via 146v having the length L2. The length L1 is smaller than length L2. In some embodiments, the conductive via 146v with length L1 is electrically connected to a part of the redistribution layer 130 or a part of the redistribution layer 160, which serves as a feed line of the antenna element ATNv; and the conductive via 146v with length L2 is electrically grounded or floated, and is referred as a ground plate/line of the antenna element ATNv. For example, as shown in FIG. 10B, the antenna elements ATNv are referred as end-fire radiation antennas of vertical polarization (e.g. polarizing in the Y direction). The polarization of the electromagnetic waves emitted by the antenna elements ATNv (polarizing in the Y direction) is perpendicular to the polarization of the electromagnetic waves emitted by the patch antennas of the antenna elements 114 (polarizing in the Z direction).

Referring to FIGS. 10A and 10C, in some embodiments, from the top view of the package structure 2, the package structure 2 includes one or more antenna elements ATNh along the X direction, and each antenna element ATNh includes two conductive vias 146h and is located aside of the semiconductor die 150 (the location of the semiconductor die 150 is shown in dotted line in FIG. 10C). From the top view, the two conductive vias 146h are L-shaped and are arranged with short sides facing each other. In some embodiments, one of the two conductive vias 146h of the antenna element ATNh is electrically connected to a part of the redistribution layer 130 or a part of the redistribution layer 160, which serves as a feed line of the antenna element ATNh; and the other conductive via 146h, which is electrically connected to the other one of a part of the redistribution layer 130 or a part of the redistribution layer 160 and is electrically grounded, serves as a ground plate/line of the antenna element ATNh. For example, as shown in FIG. 10C, the antenna elements ATNh are referred as end-fire radiation antennas of horizontal polarization (e.g. polarizing in the X direction). The polarization of the electromagnetic waves emitted by the antenna elements ATNh (polarizing in the Y direction) is perpendicular to the polarization of the electromagnetic waves emitted by the patch antennas of the antenna elements 114 (polarizing in the Z direction).

In some embodiments, the antenna elements ATNv and the antenna elements ATNh are located beside the semiconductor die 150 and located at two opposite sides of the semiconductor die 150. The arrangement and numbers of the antenna elements ATNv and the antenna elements ATNh may be adjusted according to the desired properties to what is illustrated in FIGS. 10B and 10C. In some embodiments, the antenna elements ATNv and the antenna elements ATNh may be arranged together according to the desired properties.

By arranging the antenna elements ATNv and ATNh in the desired direction and positions, the antenna elements ATNv and ATNh together may emit/receive electromagnetic waves covering all directions in the XY plane. Furthermore, since the antenna elements 114 of the antenna substrate structure 110 emitting/receiving the electromagnetic waves along the Z direction, a coverage range of the electromagnetic waves in the package structure 2 is increased, and thus the efficiency of the antenna application of the package structure 2 is enhanced.

Figure 11A:
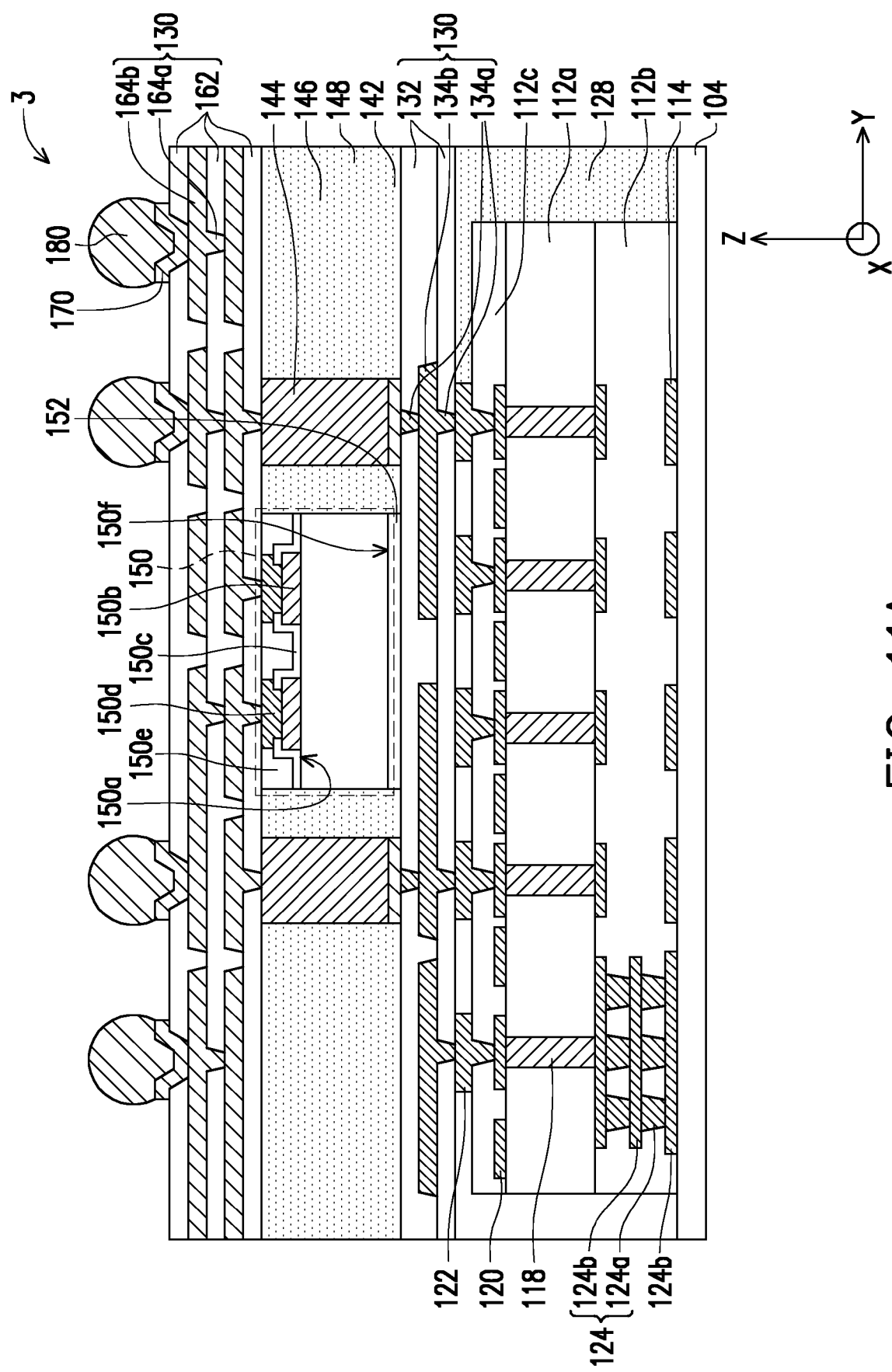
FIG. 11A is a schematic cross-sectional view of a package structure according to some exemplary embodiments of the present disclosure.

Referring to FIG. 11A the package structure 3 are similar to the package structure 1 illustrated in FIG. 9. The difference between the package structure 3 and the package structure 1 lies in that the package structure 3 includes a dipole antenna 124 in the antenna substrate structure 110. In some embodiments, the dipole antenna 124 is formed in the bottom laminated layer 112b and is located aside of the antenna elements 114. The dipole antenna 124 includes conductive vias 124a and metal layers 124b. In FIG. 11A, the number of the dipole antenna 124 is two. However, the number of the dipole antenna 124 may be one or more than two according to the desired properties. As shown in FIG. 11A, in some embodiments, the upper layer of the conductive vias 124a are connected to the metallization layer 116 electrically. The upper layer of the metal layers 124b are connected to the upper layer of the conductive vias 124a electrically. The lower layer of the conductive vias 124a are connected to the upper layer of the metal layers 124b electrically. The lower layer of the metal layers 124b are connected to the lower layer of the conductive vias 124a electrically. In some embodiments, the upper layer of the conductive vias 124a and the upper layer of the metal layer form a dipole antenna 124.

In some embodiments, the dipole antenna 124 is electrically connected to the semiconductor die 150 through the metallization layer 116, the through vias 118, the metallization layer 120, the conductive pillars 122, the redistribution layer 130, the seed layer 142, the redistribution layer 160 and the conductive pillars 150d. In some embodiments, the dipole antenna 124 is electrically connected to conductive elements 180 through the metallization layer 116, the through vias 118, the metallization layer 120, the conductive pillars 122, the redistribution layer 130, the seed layer 142, the redistribution layer 160 and the UBM patterns 170.

Figure 11B:
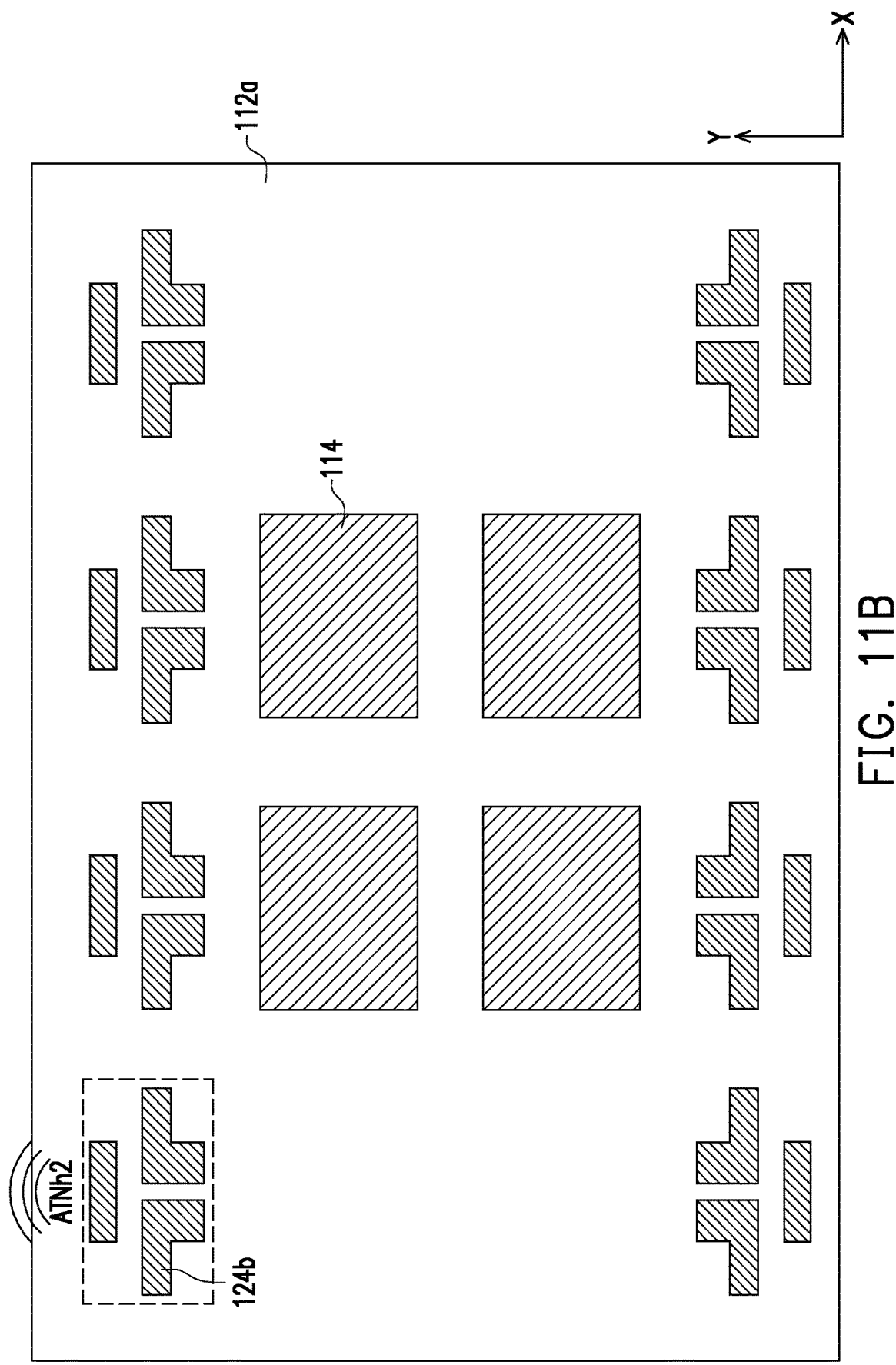
FIG. 11B is a schematic top view illustrating a relative position between antennas and a semiconductor chip depicted in FIG. 11A.

Referring to FIGS. 11A and 11B, in some embodiments, from the bottom view of the package structure 2, the bottom laminated layer 112b includes one or more antenna elements 114 along the X direction and the Y direction which forms an array of antenna elements 114, and one or more antenna elements ATNh2 is also arranged along the X direction on both sides of the array of the antenna elements 114. In some embodiments, as shown in FIG. 11B, for the antenna element ATNh2, one of the L-shaped metal layer 124b is served as a feed line of the antenna element ATNh2. The other L-shaped metal layer 124b is served as a ground plate/line of the antenna element ATNh2. For example, the antenna elements ATNh2 are referred as end-fire radiation antennas of horizontal polarization (e.g. polarizing in the Y direction). The arrangement and numbers of the antenna elements ATNh2 may be adjusted according to the desired properties. The polarization of the electromagnetic waves emitted by the antenna elements ATNh2 (polarizing in the Y direction) is perpendicular to the polarization of the electromagnetic waves emitted by the patch antennas of the antenna elements 114 (polarizing in the Z direction).

Figure 11C:
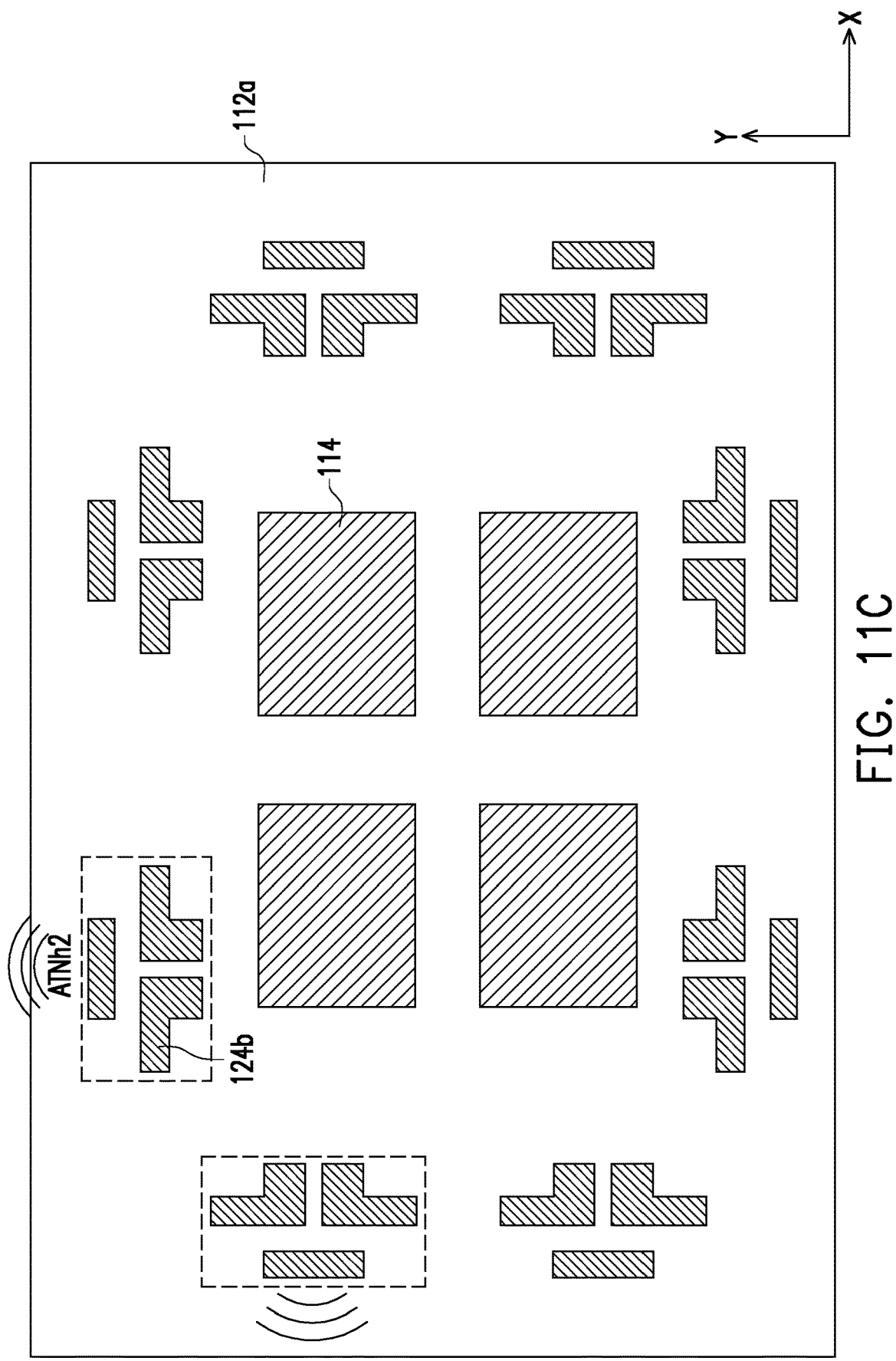
FIG. 11C is a schematic top view illustrating a relative position between antennas and a semiconductor chip depicted in FIG. 11A.

Referring to FIG. 11C, the antenna elements ATNh2 are arranged around the array of the antenna elements 114, with two antenna elements ATNh2 on each side of the array of the antenna elements 114. The number of antenna elements ATNh2 on the X or Y direction are not limited thereto. With the antenna element ATNh2 arranged along the X direction emitting/receiving the electromagnetic waves along the Y direction and the antenna element ATNh2 arranged along the Y direction emitting/receiving the electromagnetic waves along the X direction, the antenna elements ATNh2 together may emit/receive electromagnetic waves covering all directions in the XY plane. Furthermore, since the antenna elements 114 of the antenna substrate structure 110 emitting/receiving the electromagnetic waves along the Z direction, a coverage range of the electromagnetic waves in the package structure 3 is increased, and thus the efficiency of the antenna application of the package structure 3 is enhanced.

Figure 12:
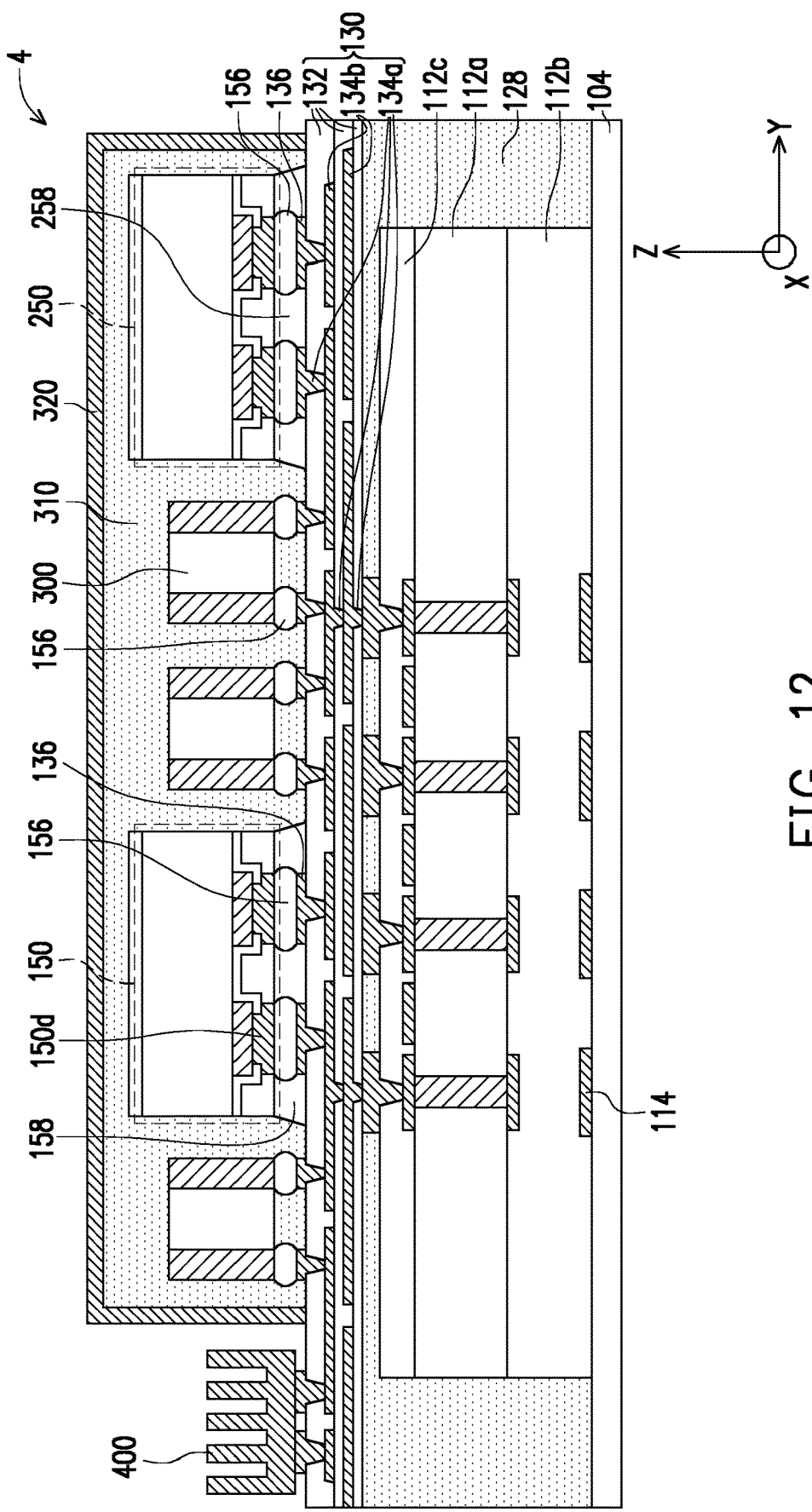
FIG. 12 is a schematic cross-sectional view of a package structure according to some exemplary embodiments of the present disclosure.

Referring to FIG. 12, a schematic cross-sectional view of the package structure 4 is shown. The package structure 4 is similar to the package structure 1 illustrated in FIG. 9. The difference between the package structure 4 and the package structure 1 is the following. A plurality of under-ball metallurgy (UBM) patterns 136 may be formed on the top surface of the topmost layer of the metallization layers 134 exposed by the topmost layer of the dielectric layers 132 for electrically connecting with conductive elements (e.g. such as conductive balls) or other additional semiconductor element (e.g., passive components or active components)). The formation methods and materials of the UBM patterns 136 are similar to the processes and materials for forming the UBM patterns 170 as described in FIG. 7, and thus are not be repeated herein.

The semiconductor die 150 is bonded to the redistribution layer 130 through flip chip bonding. The semiconductor die 150 is flipped so that the active side of the semiconductor die 150 is facing the redistribution layer 130. The conductive pillars 150d of the semiconductor die 150 is electrically connected to the UBM patterns 136 through conductive elements 156. The formation methods and materials of the conductive elements 156 are similar to the processes and materials for forming the conductive elements 180 as described in FIG. 8, and thus are not be repeated herein.

In some embodiments, as shown in FIG. 12, an underfill 158 is formed between the redistribution layer 130 and the semiconductor die 150 to cover or coat the conductive elements 156 and the UBM patterns 136 to fix the conductive elements 156. The material of the underfill 158 may be any acceptable material, such as a polymer, epoxy, molding underfill, or the like.

In some embodiments, a plurality of integrated passive devices (IPD) 300 is disposed on the redistribution layer 130. The integrated passive devices 300 are electrically connected to the UBM patterns 136 through the conductive elements 156. The term "passive" refers to the fact that the component has an intrinsic characteristic in a circuit that does not depend on power being supplied thereto. In some embodiments, the integrated passive devices 300 comprise one or more passive devices in the main structure of the integrated passive devices 300. The main structure of the integrated passive devices 300 may include a substrate and/or encapsulant. In the embodiments including a substrate, the substrate may be a semiconductor substrate, such as silicon, doped or undoped, or an active layer of a silicon-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The passive devices may include a capacitor, resistor, inductor, the like, or a combination thereof. The passive devices may be formed in and/or on the semiconductor substrate and/or within the encapsulant and may be interconnected by interconnect structures formed by, for example, metallization patterns in one or more dielectric layers on the main structure to form the integrated passive devices 300. The integrated passive devices 300 may be the same types of IPD components, or may be different types of IPD components. The integrated passive devices 300 may be surface mount devices (SMDs), 2-terminal IPDs, multi-terminal IPDs, or other types of passive devices.

In some embodiments, a second semiconductor die 250 is also arranged on the redistribution layer 130. The semiconductor die 250 is bonded to the redistribution layer 130 through flip chip bonding. An active side of the semiconductor die 250 is facing the redistribution layer 130. The bonding process of the semiconductor die 250 is similar to the processes for bonding the semiconductor die 150 as described in FIG. 12, and thus are not be repeated herein. The underfill 258 is formed between the redistribution layer 130 and the semiconductor die 250 to cover or coat the conductive elements 156 and the UBM patterns 136 to fix the conductive elements 156. The formation methods and materials of the underfill 258 are similar to the processes and materials for forming the underfill 158, and thus are not be repeated herein.

In some embodiments, the semiconductor die 250 includes a power management integrated circuit (PMIC). The PMIC, receives power supplied to the package structure 4 and controls and manages the supply of power to the electronic components of the package structure 4, such as the semiconductor die 150, the antenna elements 114 and the integrated passive devices 300. In some embodiments, the semiconductor die 250 electrically connects to the semiconductor die 150 through the conductive elements 156, the UBM patterns 136, the redistribution layer 130, the UBM patterns 136 and the conductive elements 156. In some embodiments, the semiconductor die 250 electrically connects to the integrated passive devices 300 through the conductive elements 156, the UBM patterns 136, the redistribution layer 130, the UBM patterns 136 and the conductive elements 156.

In some embodiments, the package structure 4 further includes a connector 400 connecting to the UBM patterns 136 electrically and mechanically. The connector 400 is disposed on the surface of the redistribution layer 130, and is located aside of the semiconductor dies 150 and 250. The connectors 400, the integrated passive devices 300, the semiconductor dies 150 and 250 are all disposed on the surface of the redistribution layer 130. The connector 400 transmits the electric signals in and/or out from the package structure 4. In some embodiments, the baseband signals are transmitted through the connector 400 to semiconductor dies 150 and 250 in the package structure 4 to operate the semiconductor dies 150 and 250. The connector 400 electrically connects to the redistribution layer 130 through the UBM patterns 136. The connector 400 electrically connects to the semiconductor dies 150 and 250, the antenna substrate structure 110, and other semiconductor components through the UBM patterns 136 and the redistribution layer 130.

In some embodiments, an insulating encapsulant 310 is formed by partial molding to laterally wrapped the semiconductors dies 150 and 250, and the integrated passive devices 300. A span of the insulating encapsulant 310 is smaller than a span of the insulating encapsulant 128. The insulating encapsulant 310 covers a portion of the top surface of the topmost layer of the dielectric layers 132 of the redistribution layer 130. The connector 400 and a portion of the top surface of the topmost layer of the dielectric layers 132 of the redistribution layer 130 around the connector 400 are exposed by the insulating encapsulant 310. The sidewalls of the insulating encapsulant 310 are not aligned with the sidewalls of the redistribution layer 130. A size of a projection of the insulating encapsulant 310 on the redistribution layer 130 is smaller than the size of top surface of the redistribution layer 130. The formation methods and materials of the insulating encapsulant 310 are similar to the processes and materials for forming the insulating encapsulant 128 and the insulating encapsulant 148, and thus are not be repeated herein. The insulating encapsulant 310, the semiconductor dies 150 and 250, and the integrated passive devices 300 forms a multi-die integrated fan-out (InFO) package.

In some embodiments, a metal shielding 320 is formed on the insulating encapsulant 310 to enclose the insulating encapsulant 310. In some embodiments, the edge of the metal shielding 320 mechanically connects with the top surface of the topmost layer of the dielectric layers 132 of the redistribution layer 130. In some embodiments, part of the sidewalls of the metal shielding 320 is aligned with the sidewalls of the redistribution layer 130. In some of the embodiments, the sidewalls of the metal shielding 320 are not aligned with the sidewalls of the redistribution layer 130. In some embodiments, the material of the metal shielding 320 includes aluminum, and the metal shielding 320 is formed by electroplating or deposition. The metal shielding 320 forms a conformal shielding to the semiconductor dies 150 and 250, and the integrated passive devices 300, which prevents the electromagnetic interference (EMI) from external sources, to keep the semiconductor dies 150 and 250 working properly.

In package structure 4, a multi-die InFO package is formed on the antenna substrate structure 110, where the semiconductor dies 150 and 250 are disposed on the surface of the redistribution layer 130 and are connected to the redistribution layer 130 through flip chip bonding. The integrated passive devices 300 are also disposed on the surface of the redistribution layer 130 and are located aside of the semiconductor dies 150 and 250. The connector 400 is disposed on the surface of the redistribution layer 130 and is located aside of the semiconductor dies 150 and 250. A partial-molded insulating encapsulant 310 is formed to encapsulate the semiconductor dies 150 and 250, and the integrated passive devices 300, wherein the connector 400 and a portion of the top surface of the redistribution layer 130 is exposed by the insulating encapsulant 310. The partial insulating encapsulant 310 is further covered by the metal shielding 320, which provides the conformal shielding to the semiconductor dies 150 and 250 and prevents the semiconductor dies 150 and 250 from the external EMI.

Figure 13:
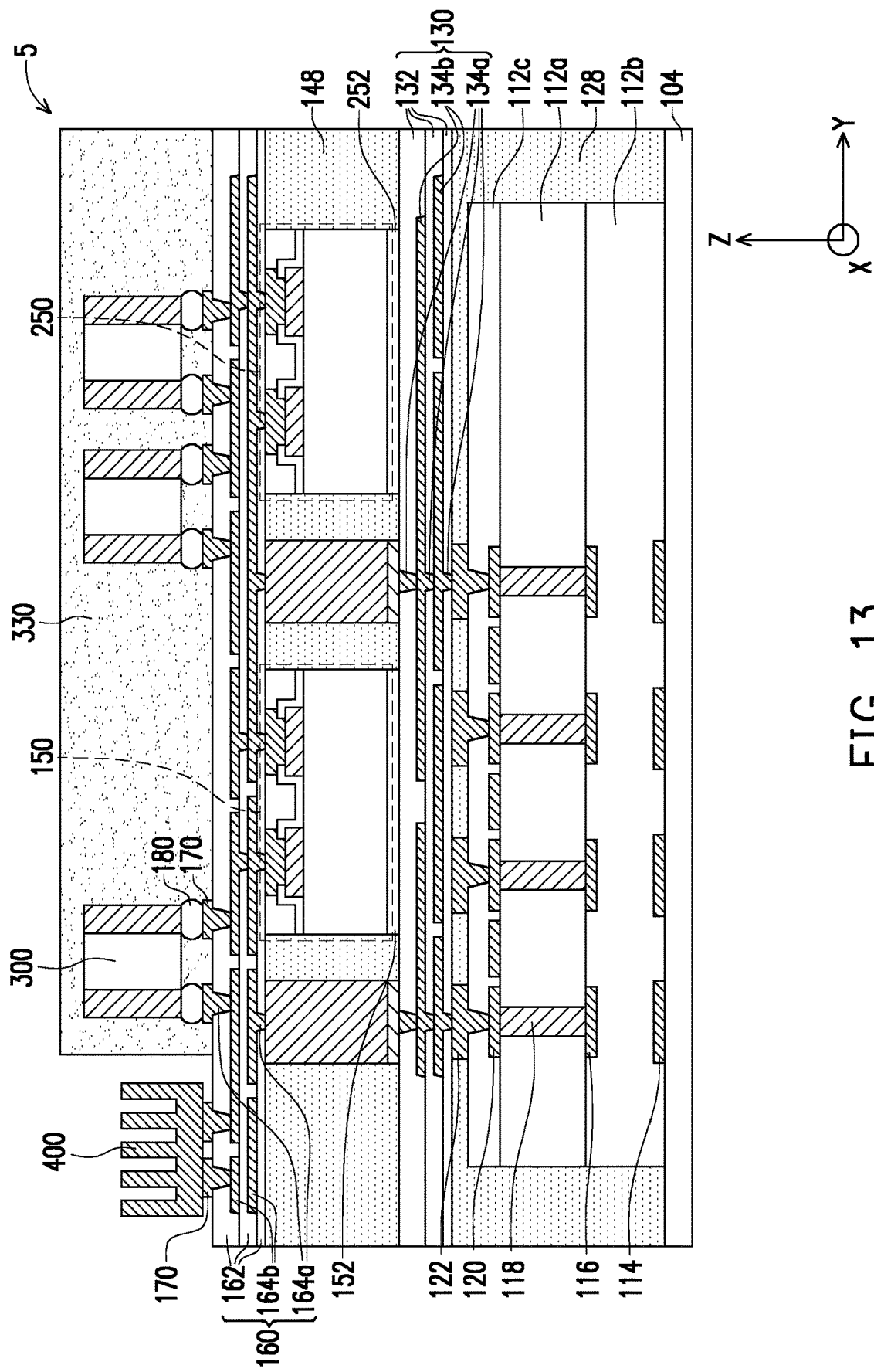
FIG. 13 is a schematic cross-sectional view of a package structure according to some exemplary embodiments of the present disclosure.

Referring to FIG. 13, FIG. 13 is a schematic cross-sectional view of the package structure 5. The package structure 5 is similar to the package structure 1 illustrated in FIG. 9. The difference between the package structure 5 and the package structure 1 is the following.

The package structure 5 includes a semiconductor die 250. The semiconductor is disposed on the redistribution layer 130 through a die attach film 252. The materials of the die attach film 252 are similar to the processes and materials of the die attach film 152, and thus are not be repeated herein. The method of disposing the semiconductor die 250 on the die attach film 252 is similar to the process of disposing the semiconductor die 150 one the die attach film 152, and thus are not be repeated herein.

In some embodiments, the semiconductor die 250 includes a power management integrated circuit (PMIC), which receives power supplied to the package structure 5 and controls and manages the supply of power to the electronic components of the package structure 5. The semiconductor die 250 is also encapsulated by the insulating encapsulant 148. The semiconductor die 250 is electrically and mechanically connected to the redistribution layer 160 through the active side of the semiconductor die 250.

In some embodiments, a redistribution layer 160 is formed on the conductive vias 144, the semiconductor dies 150 and 250, and the insulating encapsulant 148. In some embodiments, the redistribution layer 160 includes sequentially forming one or more dielectric layers 162 and one or more metallization layers 164 in alternation. In some embodiments, a plurality of UBM patterns 170 is formed on the top surface of the topmost layer of the metallization layers 164 exposed by the topmost layer of the dielectric layers 162 for electrically connecting with conductive elements.

In some embodiments, a plurality of integrated passive devices 300 is disposed on the redistribution layer 160. The integrated passive devices 300 are electrically connected to the UBM patterns 170 through the conductive elements 180. The integrated passive devices 300 electrically connect to the semiconductor dies 150 or 250 through the UBM patterns 170, the redistribution layer 160.

In some embodiments, the package structure 5 further includes a connector 400 disposed on the redistribution layer 160. The connector 400 and the integrated passive devices 300 are disposed on the same surface of the redistribution layer 160. The connector 400 receives electric signals or electric signals to power the package structure 5. The connector 400 electrically connects to the redistribution layer 160 through the UBM patterns 170. The connector 400 electrically connects to the semiconductor dies 150 and 250, the antenna substrate structure 110 and other semiconductor components through the UBM patterns 170 and the redistribution layer 160.

In some embodiments, the insulating encapsulant 330 is formed by partial molding and covers the integrated passive devices 300 and a portion of the top surface of the topmost layer of the dielectric layers 162. A span of the insulating encapsulant 330 is smaller than a span of the insulating encapsulant 128. The span of the insulating encapsulant 310 is also smaller than a span of the insulating encapsulant 148. The connector 400 and a portion of the top surface of the topmost layer of the dielectric layers 162 of the redistribution layer 160 around the connector 400 are exposed by the insulating encapsulant 330. The sidewalls of the insulating encapsulant 330 are not aligned with the sidewalls of the redistribution layer 160. A size of a projection of the insulating encapsulant 330 on the redistribution layer 160 is smaller than the size of the top surface of the redistribution layer 160. The formation methods and materials of the insulating encapsulant 330 are similar to the processes and materials for forming the insulating encapsulant 128, the insulating encapsulant 148 and the insulating encapsulant 310, and thus are not be repeated herein.

In package structure 5, since the integrated passive devices 300 and the connector 400 are mounted on the multi-die InFO package, the size of the multi-die InFO package may be reduced and the cost of production may also be reduced.

According to some embodiments, a package structure is disclosed. The package structure includes a semiconductor die, an antenna substrate structure, and a redistribution layer. The semiconductor die is laterally wrapped by a first encapsulant. The antenna substrate structure is disposed over the semiconductor die, wherein the antenna substrate structure includes a circuit substrate and at least one antenna element inlaid in the circuit substrate. The redistribution layer is disposed between the semiconductor die and the antenna substrate structure, wherein the at least one antenna element is electrically connected with the semiconductor die through the circuit substrate and the redistribution layer. The at least one antenna element includes patch antennas.

According to some embodiments, a package structure is disclosed. The package structure includes a redistribution layer, an antenna substrate structure, at least one integrated passive device, a first semiconductor die and a second semiconductor die, and a connector. The redistribution layer has a first surface and a second surface opposite to the first surface. The antenna substrate structure is disposed over the first surface of the redistribution layer and laterally wrapped by a first encapsulant, wherein the antenna substrate structure includes a first laminated layer, a core layer disposed on the first laminated layer, a second laminated layer disposed on the core layer, and the first laminated layer includes at least one antenna element. The at least one integrated passive device is disposed over the second surface of the redistribution layer and encapsulated by a second encapsulant. The first semiconductor die and the second semiconductor die are disposed over the second surface of the redistribution layer and located between the at least one integrated passive device and the antenna substrate structure. The connector is disposed over the second surface of the redistribution layer and located aside of the at least one integrated passive device. A span of the second encapsulant is smaller than a span of the first encapsulant, the connector is located outside of the second encapsulant, and a portion of the second surface of the redistribution layer is exposed.

According to some embodiments, a method for forming a package structure is disclosed. The method includes the followings. An antenna substrate structure having a circuit substrate and at least one antenna element inlaid in the circuit substrate is provided. The antenna substrate structure is disposed over a carrier, facing the at least one antenna element toward the carrier. The antenna substrate structure is molded with a first encapsulant covering sidewalls of the antenna substrate structure. A redistribution layer is formed on the molded antenna substrate structure and the first encapsulant. A semiconductor die is disposed on the redistribution layer. The semiconductor die is molded with a second encapsulant. The at least one antenna element is electrically coupled with the semiconductor die through the circuit substrate and the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor die laterally wrapped by a first encapsulant;
   an antenna substrate structure disposed over the semiconductor die, wherein the antenna substrate structure includes a circuit substrate, at least one antenna element inlaid in the circuit substrate, and at least one first dipole antenna embedded in the circuit substrate and located beside the at least one antenna element; and
   a redistribution layer disposed between the semiconductor die and the antenna substrate structure, wherein the at least one antenna element is electrically connected with the semiconductor die through the circuit substrate and the redistribution layer;
   wherein the at least one antenna element includes patch antennas,
   wherein a polarization of electromagnetic waves emitted by the at least one first dipole antenna is perpendicular to a polarization of the electromagnetic waves emitted by the patch antennas.

2. The package structure of claim 1, wherein the semiconductor die includes a radio frequency integrated circuit.

3. The package structure of claim 1, wherein the antenna substrate structure is laterally wrapped by a second encapsulant.

4. The package structure of claim 3, further comprising a die attach film covering a surface of the at least one antenna element and a surface of the second encapsulant.

5. The package structure of claim 3, wherein the first encapsulant is separate from the second encapsulant by the redistribution layer.

6. The package structure of claim 3, wherein the circuit substrate includes a core layer and metallization patterns disposed on the core layer, locations of the metallization patterns correspond to locations of the patch antennas, and a material of the second encapsulant is different from a material of the core layer.

7. The package structure of claim 1, further comprising at least one second dipole antenna disposed aside the semiconductor die and wrapped by the first encapsulant, wherein a polarization of electromagnetic waves emitted by the at least one second dipole antenna is perpendicular to a polarization of electromagnetic waves emitted by the patch antennas.

8. The package structure of claim 7, further comprising conductive vias located aside of the semiconductor die and located between the semiconductor die and the at least one second dipole antenna.

9. The package structure of claim 1, further comprising conductive vias located aside of the semiconductor die and wrapped by the first encapsulant.

10. The package structure of claim 1, further comprising at least one integrated passive device electrically connected to the semiconductor die.

11. A package structure, comprising:
    a redistribution layer having a first surface and a second surface opposite to the first surface;
    an antenna substrate structure, disposed over the first surface of the redistribution layer and laterally wrapped by a first encapsulant, wherein the antenna substrate structure includes a first laminated layer, a core layer disposed on the first laminated layer, a second laminated layer disposed on the core layer, and the first laminated layer includes at least one antenna element;

at least one integrated passive device, disposed over the second surface of the redistribution layer and encapsulated by a second encapsulant;

a first semiconductor die and a second semiconductor die, disposed over the second surface of the redistribution layer and located between the at least one integrated passive device and the antenna substrate structure; and a connector, disposed over the second surface of the redistribution layer and located aside of the at least one integrated passive device, wherein a span of the second encapsulant is smaller than a span of the first encapsulant, the connector is located outside of the second encapsulant, and a portion of the second surface of the redistribution layer is exposed.

12. The package structure of claim 11, further comprising a metal shielding covering a top surface and sidewalls of the second encapsulant, wherein the metal shielding is connected to the second surface of the redistribution layer.

13. The package structure of claim 11, wherein the at least one antenna element includes patch antennas.

14. The package structure of claim 11, wherein the first semiconductor die is a radio frequency integrated circuit or a power management integrated circuit and the second semiconductor die is the other.

15. The package structure of claim 11, wherein the first semiconductor die, the second semiconductor die, and the at least one integrated passive device are encapsulated by the second encapsulant.

16. The package structure of claim 11, further comprising a third encapsulant laterally wrapping the first and second semiconductor dies.

17. A method for forming a package structure, comprising:

providing an antenna substrate structure having a circuit substrate, at least one antenna element inlaid in the circuit substrate, and at least one first dipole antenna embedded in the circuit substrate and located beside the at least one antenna element;

disposing the antenna substrate structure over a carrier, facing the at least one antenna element toward the carrier;

molding the antenna substrate structure with a first encapsulant covering sidewalls of the antenna substrate structure;

forming a redistribution layer on the molded antenna substrate structure and the first encapsulant;

disposing a semiconductor die on the redistribution layer; and molding the semiconductor die with a second encapsulant, wherein the at least one antenna element is electrically coupled with the semiconductor die through the circuit substrate and the redistribution layer, wherein a polarization of electromagnetic waves emitted by the at least one first dipole antenna is perpendicular to a polarization of electromagnetic waves emitted by the at least one antenna element.

18. The method of claim 17, further comprising:

forming at least one second dipole antenna aside the semiconductor die and wrapping by the second encapsulant, wherein a polarization of electromagnetic waves emitted by the at least one second dipole antenna is perpendicular to a polarization of electromagnetic waves emitted by the at least one antenna element.

19. The package structure of claim 1, wherein the at least one first dipole antenna comprises two L-shaped metal layers.

20. The package structure of claim 7, wherein the at least one second dipole antenna comprises two L-shaped conductive vias.

* * * * *